(12) United States Patent
Onozawa

(10) Patent No.: US 6,794,201 B2  
(45) Date of Patent: Sep. 21, 2004

(54) METHOD OF FABRICATING SEMICONDUCTOR DEVICE

(75) Inventor: Sachiko Onozawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 501 days.

(21) Appl. No.: 09/726,054

(22) Filed: Nov. 30, 2000

(65) Prior Publication Data

US 2001/0003050 A1 Jun. 7, 2001

(30) Foreign Application Priority Data

Dec. 3, 1999  (JP) .......................................... 11-344638

(51) Int. Cl.⁷ ............................................. H01L 21/82
(52) U.S. Cl. ..................... 438/10; 438/129; 438/130; 716/2; 716/10; 716/12
(58) Field of Search ................................ 438/129, 130, 438/10; 716/2, 10, 12, FOR 491

(56) References Cited

U.S. PATENT DOCUMENTS 4,977,371 A * 12/1990 Oliver et al. ............... 324/765
5,986,283 A * 11/1999 Bush et al. .................. 257/48

FOREIGN PATENT DOCUMENTS

| JP | 07-235554 | 9/1995 |
| JP | 11-045891 | 2/1999 |
| JP | 11-163642 | 6/1999 |

* cited by examiner

*Primary Examiner*—George Fourson  
*Assistant Examiner*—Thanh V Pham  
(74) *Attorney, Agent, or Firm*—Rabin & Berdo, P.C.

(57) ABSTRACT

A method of fabricating a semiconductor device characterized in that the method includes the steps of forming basic structures of unit FETs on each of 'm' active layer regions more than the number of designed unit FETs and determining the number 'n' of desired basic structures on the basis of a drain current value of the semiconductor device predicted from a measured value of the drain current characteristics of one of the basic structures. The contact holes for electrical connections to electrodes of each of the unit FETs are formed for only the regions on 'n' basic structures in an inter-layer insulating film. In this manner, there is provided a method of fabricating a semiconductor device, the method being capable of improving degraded characteristics after the characteristics of TEG-FET have been measured.

8 Claims, 15 Drawing Sheets

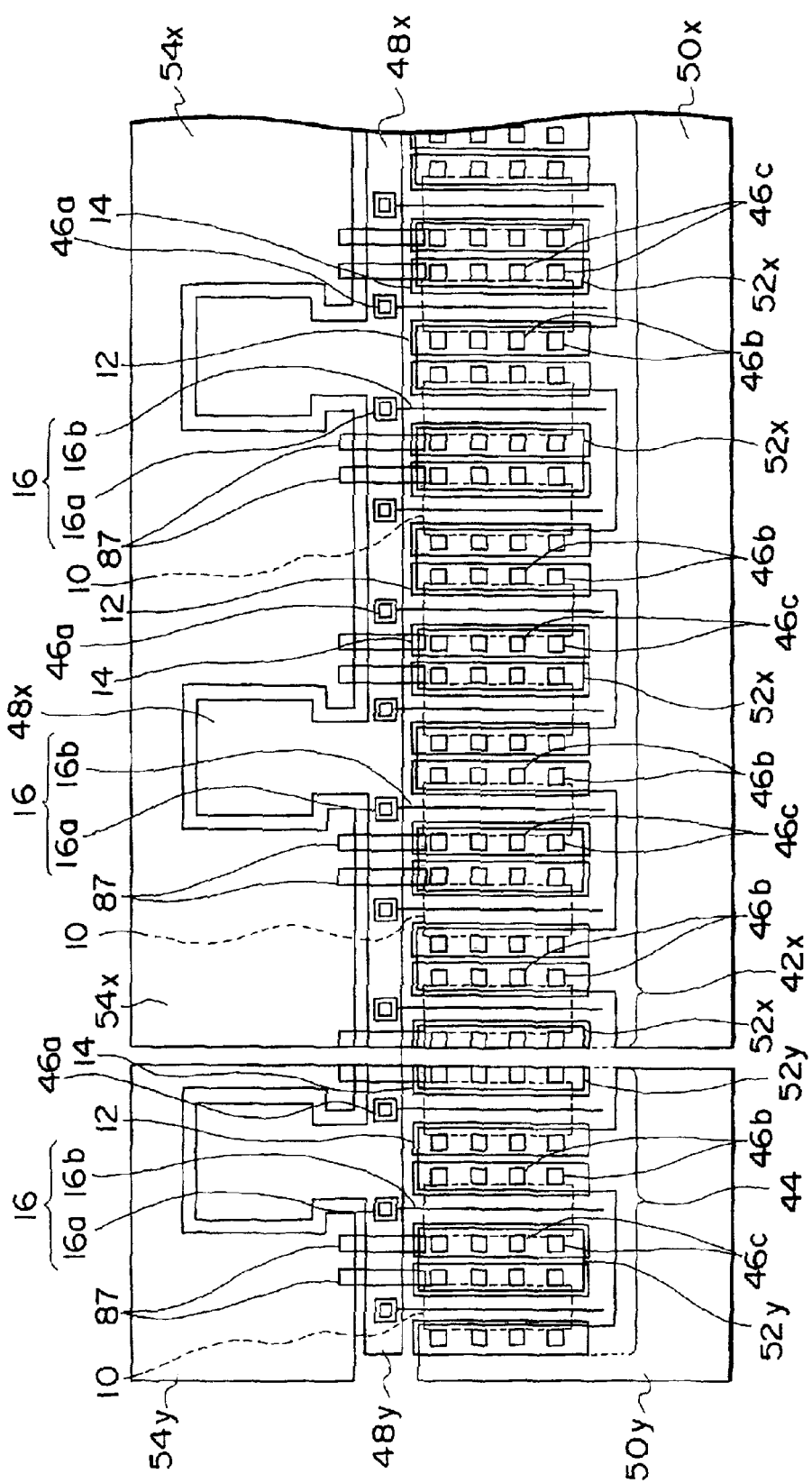

METHOD OF FABRICATING SEMICONDUCTOR DEVICE

BACKGROUND OF THE INVENTION

The present invention relates to a method of fabricating a semiconductor device, and in particular to a semiconductor device employing a field effect transistor that operates at an ultra-high frequency band in the GHz (Giga Hertz) range.

Conventionally, a semiconductor device employing a field effect transistor (hereinafter, referred to as FET) that operates at an ultra-high frequency in the GHz range generally has a structure as shown in FIG. 13, for example. FIG. 13 is a pattern perspective view showing a conventional semiconductor device (an FET chip) when viewed from the top. At this semiconductor device, a plurality of unit FETs 200 are disposed in a line.

A unit FET 200 is provided on an active layer 202 formed on an underlying substrate. This unit FET 200 comprises a basic structure 100 having a source electrode 204, a drain electrode 206 and a gate electrode 208 (FIGS. 14A–14E). The gate electrode 208 is composed of an electrode section 208a and a gate finger 208b. The gate finger 208b is disposed between the source electrode 204 and the drain electrode 206. In addition, adjacent unit FETs 200 each share the source electrode 204 and the drain electrode 206. The gate finger 208b is continuous with the electrode section 208a, and the electrode section 208a is connected to a gate pad 212 that is a power supply point via a first contact hole 210 that penetrates an inter-layer insulating film formed on the gate electrode 208. The source electrode 204 is connected to a source pad 216 via a second contact hole 214 that penetrates an inter-layer insulating film formed thereon. The drain electrode 206 is connected to a first drain pad 220 via a third contact hole 218 that penetrates an inter-layer insulating film formed thereon. Further, this first drain pad 220 is connected to a second drain pad 224 on an air bridge wiring 222 formed so as to extend to the gate pad 212.

Now, a method of fabricating this semiconductor device will be described with reference to FIGS. 14A–14E. FIGS. 14A–14E are schematic views showing the structure in each of the main steps which are carried out to form a basic structure 100 of a unit FET.

First, a wafer that is a substrate 300 is provided. Then, an active layer 202 is formed by using an epitaxial growth or an ion implantation method on this substrate 300. Here, an n-type channel layer 302 and an $n^+$ contact layer 304 are formed as the active layer 202. Next, a source electrode 204 and a drain electrode 206 that are two ohmic electrodes consisting of a metal made of three layers, i.e., AuGe, Ni, and Au layers are formed in an active region of the active layer 202 (FIG. 14A). Thereafter, an $SiO_2$ mask having an opening is provided on the active layer region that includes these electrodes, and then, a region of the $n^-$ contact layer 304 is etched by employing this mask. In this manner, a wide recess 306 that exposes a region of a part of the n-type channel 302 is formed such that a portion 304x of an $n^+$ contact layer 304 remains (FIG. 14B). Thereafter, an $SiO_2$ film is further formed at the upper side of the active layer that includes the inside of the wide recess 306, and an opening 308a having a smaller opening diameter than the above wide recess 306 is provided, thereby forming a mask 308. Etching is carried out by employing this mask 308, and a narrow recess 310 having a part of the n-type channel layer 302 removed therefrom is formed in the wide recess 306 (FIG. 14C). Next, a gate metal 312 is spatter-deposited on the entire surface, and is embedded in the narrow recess 310 (FIG. 14D). Subsequently, the gate metal 312 is processed so as to have the configuration of the gate metal 208 by employing dry etching, and then, the mask 308 of the $SiO_2$ film is removed (FIG. 14E). In this manner, the basic structure 100 of the unit FET is obtained.

This basic structure is employed as a TEG-FET (Test Element Group-Field effect transistor), its characteristics are measured, and the characteristics of the finally obtained FET is predicted. Thereafter, an inter-layer insulating film is formed so as to cover the ohmic electrodes 204 and 206 and the gate electrode 208. Thereafter, first to third contact holes 210, 214, and 218 are formed at the inter-layer insulating film so as to expose the two ohmic electrodes 204 and 206 and the gate electrode 208. Next, a first wiring is formed so as to fill a contact hole. In this step of forming the first wiring, the source pad 216, first drain pad 220, second drain pad 224, and gate pad 212 shown in FIG. 13, are formed.

A part of the source pad 216 fills the second contact hole 214 that exposes a surface of the source electrode 204, and is connected to the source electrode 204. Similarly, a part of the first drain pad 220 fills the third contact hole 218 that exposes a surface of the drain electrode 206, and is connected to the drain electrode 206. In addition, a part of the gate pad 212 fills the first contact hole 210 that exposes the gate electrode 208, and is connected to the gate electrode 208. When a structure having this first wiring formed therein is viewed from the top in a planar manner, the first drain pad 220 and the second drain pad 224 are disposed at both sides while the gate pad 212 is sandwiched between these pads (FIG. 13).

After the first wiring has been formed, an air bridge wiring 222 that connects the first drain pad 220 and the second drain pad 224 to each other is formed as a second wiring. This air bridge wiring 222 is formed so as to encompass the gate pad 212, and the first and second drain pads 220 and 224 are connected to each other (FIG. 13).

Thereafter, a passivation film (not shown) is formed on the top surface of the structure.

A semiconductor device using the FET is formed by using the steps as has been described above.

In the semiconductor device with the above-described structure, the size of the FET, in particular, the gate width is determined by a width of the active region and the number of gate fingers. Therefore, the gate width depends on patterns of two masks; a mask employed for forming an active layer initially provided; and a mask for forming a gate electrode and a gate finger. When excess etching is carried out at the step of carrying out recess etching during the FET fabricating, for example, in an active region, the thickness of the active layer is reduced. Thus, there is a risk that a desired drain current value cannot be ensured. In contrast, in the case of insufficient etching, the thickness of the active layer is increased, and a drain current of equal to or more than the set value flows out.

Even if it is judged that an excess or shortage occurs with the drain current value by virtue of the aforementioned reason, as a result of measuring the characteristics of this TEG-FET, at a time when the basic structure 100 of the FET (TEG-FET) is formed, although a threshold voltage of the TEG-FET is a value within a desired range, this excess or shortage cannot be compensated for during the subsequent steps. Therefore, there is a risk that the FET cannot achieve its desired output characteristics. In addition, the FET having low output characteristics is faulty, and thus, there is a risk that the yield of a wafer lot is decreased.

SUMMARY OF THE INVENTION

The present invention provides a method of fabricating a semiconductor device that enables improvement of degraded characteristics after the characteristics of the TEG-FET has been measured.

In the present invention, when a semiconductor device having a structure in which a plurality of unit FETs are arranged in a line is fabricated, the number of the unit FETs in which a desired drain current value is obtained is first designed in advance. For example, this number is defined as 'p'. Next, a number 'm' of basic structures of unit FETs are formed, where the number 'm' is more than 'p', the drain current value of each of these structure is measured, and the drain current value of the semiconductor device after being fabricated is predicted from this measured value. Thereafter, a predicted value and a desired drain current value are compared with each other, and the number 'n' of the semiconductor devices in which a desired drain current value is obtained is determined.

Here, the basic structure is defined as an element before being wired in which the source electrode, drain electrode, and gate electrode are formed on the region of the active layer. First, as long as 'm' (which is more than 'p') basic structures are formed, no shortage occurs with the drain current value of the semiconductor device to be fabricated. At a time when the basic structure is formed, a drain current value of each of the semiconductor devices to be obtained from the drain current value by each of the basic structures is predicted and this value is always greater than a desired value. Hence, the number of basic structures corresponding to a difference between the predicted value and the desired value is obtained, thereby making it possible to determine the number 'n' of the basic structures such that the minimum drain current value can be determined. Thus, even if any error occurs during the steps up until the basic structure has been formed, the number of the basic structures is adjusted, whereby the drain current value of the finally obtained semiconductor device can be set to a desired value. Therefore, at the step of wiring the basic structure which is to be carried out subsequently, a wiring pattern may be formed on 'n' basic structures. In this manner, a semiconductor device in which a desired drain current value is obtained can be fabricated with high yield.

The drain current value of one basic structure is measured, and the drain current value of the semiconductor device is predicted from this measured value. This predicted value is a value uniquely obtained by co-relating the measured drain current value to a characteristic chart. The chart shows a relationship between the drain current value by each of the basic structures at a time when the basic structure has been formed by employing the same fabricating method in advance and the drain current value of the semiconductor device after fabricated.

More specifically, this method of fabricating the semiconductor device preferably comprises the following steps of:

(1) forming 'm' active layer regions so as to be arranged in a line on the substrate, where the number 'm' is more than the number of unit FETs that have been designed;

(2) forming the gate electrode, source electrode, and drain electrode, respectively, on each region of 'm' active layer regions, thereby forming the basic structure of 'm' unit FETs;

(3) predicting a drain current value of the semiconductor device from the measured value obtained by measuring the drain current value by each of the basic structures, and comparing this predicted value and a desired drain current value, thereby determining the number 'n' of basic structures in which a desired drain current value is obtained;

(4) forming an inter-layer insulating film on the basic structure; and (5) forming simultaneously a first contact hole that penetrates this inter-layer insulating film, and exposes a part of the surface of the gate electrode; a second contact hole that penetrates the inter-layer insulating film, and exposes a part of the surface of the source electrode; and a third contact hole that penetrates the inter-layer insulating film, and exposes a part of the surface of the drain electrode.

Forming the first to third contact holes, that is, the above step (5), is carried out for only a region on 'n' basic structures of the inter-layer insulating film, provided that m≧n and m, n>0.

At a time when a basic structure of the unit FET is formed, when this basic structure is employed as a TEG-FET, thereby measuring a drain current value, the number 'm' of basic structures is more than the number of unit FETs that has been designed in advance. Thus, a higher value than a desired drain current value is obtained. In the case that the number of basic structures formed is the same as the number of FETs that has been designed in advance, if an error occurs during any of the steps of forming the basic structures, and a shortage occurs with the drain current value of the basic structure to be obtained, this shortage cannot be compensated for during the subsequent steps. As a result, the FET can not be presented as a product. In contrast, as described above, when the number of basic structures is more than the number of FETs that has been designed in advance, there is no risk that shortage occurs with the drain value of the basic structure. In the fabricating method according to the present invention, although the drain current value of the semiconductor device predicted from the drain current value of each of the basic structures is higher than a desired value, this value can be adjusted so that a desired value is obtained during the subsequent steps. The number of basic structures corresponding to the drain current difference between the predicted value and a desired value of the drain current is obtained, and the required number 'n' of basic structures in a structure being fabricated is determined. Hence, after the inter-layer insulating film has been formed on the basic structure, the step (5) of forming the first to third contact holes in the inter-layer insulating film so that a part of each basic structure is exposed, is carried out for only a region of the inter-layer insulating film on the determined 'n' basic structure. As a result, basic structures other than the 'n' basic structures are not elements that will operate in a semiconductor device to be fabricated. Hence, a semiconductor device in which desired drain current characteristics are obtained can be fabricated with high yield.

In addition, forming the first, second, and third contact holes in the region that corresponds to 'n' basic structure of 'n' inter-layer insulating films, i.e., the above step (5) is preferably carried out comprising the following the steps of:

(5-1) forming a resist film on the inter-layer insulating film;

(5-2) carrying out exposure and development for the resist film by employing a mask in which there are provided windows for forming contact holes that corresponds to the first to third contact holes to be formed in a region of the inter-layer insulating film of each of the basic structures, wherein the (5-2) step is carried out by moving mask positions by a distance corresponding to that of one of the basic structures, to thereby form a resist pattern that has 'n' contact hole patterns;

(5-3) etching the inter-layer insulating film by employing a resist pattern formed by repeating the (5-2) steps 'n' times.

In this manner, first to third contact holes can be formed for exactly 'n' basic structures. In addition, even if desired drain current values are different, and the required number 'n' of basic structures varies, the aforementioned mask is for one basic structure, and therefore the same mask can be used regardless of the number of basic structures.

Another method of fabricating a semiconductor device having a structure in which a plurality of unit FETs are arranged in a line, as described above, comprises the 5 steps of:

(1) forming 'm' active regions on a substrate;

(2) forming a gate electrode, a source electrode, and a drain electrode on 'm' active layer regions, thereby forming a basic structure of the unit FET;

(3) determining the number 'n' of basic structures in which a desired drain current value is obtained;

(4) forming an inter-layer insulating film on a basic structure; and (5) forming the first to third contact holes that correspond to 'm' basic structures on the inter-layer insulating film, the method further comprising the following 2 steps of:

(6) forming a gate pad in the first contact hole and on the inter-layer insulating film, forming a source pad in a second contact hole and on the inter-layer insulating film; forming a first drain pad in a third contact hole and on the inter-layer insulating film, and forming a second drain pad on the inter-layer insulating film, the pad being spaced apart from the first drain pad; and (7) forming an air bridge wiring that connects the first and second drain pads to each other.

In addition, the pad forming step which is the above mentioned step (6) is carried out for the region on the 'n' basic structure on the inter-layer insulating film, provided that n≦m and 0<m and n.

The first contact hole exposes a part of the gate electrode, and thus, a gate pad formed in this first contact hole and on the inter-layer insulating film is electrically connected to a gate electrode. In addition, the second contact hole exposes a part of the source electrode, and thus, the source pad formed in this second contact hole and the inter-layer insulating film is electrically connected to the source electrode. In addition, the third contact hole exposes a part of the drain electrode, and the first drain pad formed in this third contact hole and on the inter-layer insulation layer is electrically connected to the drain electrode. Hence, materials which compose the gate pad, source pad, and first drain pad is not embedded in the contact hole formed respectively in the inter-layer insulating film on the basic structures other than 'n' basic structures, and thus, these pads, gate electrode, source electrode, and drain electrode are not electrically connected to each other, respectively. Therefore, in the semiconductor device to be fabricated, only 'n' unit FETs are effective FETs. Hence, a desired drain current value of the semiconductor device can be obtained. In addition, the drain pad connected to the drain electrode is composed of two pads, i.e., a first drain pad and a second drain pad. This is in view of the of a physical positional relationship which is taken into consideration for subsequent wiring on the inter-layer insulating film. The two pads are connected via an air bridge wiring. As long as this drain pad can be satisfactorily disposed as one pad on the inter-layer insulating film, it may be formed as one drain pad in a manner similar to the gate pad and the source pad. In addition, although the first drain pad and the second drain pad are connected to each other via an air bridge wiring, it is possible to make connection on the inter-layer insulating film via a general wiring. Air bridge wiring is preferably employed from the viewpoint of FET performance.

Preferably, the above pad forming step (6) further comprises the following steps of:

(6-1) forming a resist film on the inter-layer insulating film;

(6-2) forming a pad forming resist pattern to be developed after the resist film has been subjected to exposure by employing a pad pattern mask that has a pattern of the gate pad, source pad, first drain pad, and second drain pad; and a pad erasing mask that has a pattern configured so as to surround a predetermined pad forming region on basic structures other than non-'n' basic structures; and (6-3) forming the gate pad, source pad, first drain pad, and second drain pad by means of a lift-off method employing this pad forming resist pattern.

When a resist film is subjected to exposure by employing a pad pattern mask, a pattern latent image of regions for 'm' basic structures is formed on the resist film. When exposure is carried out by employing the pad erasing mask for this resist film, regions of the resist film that corresponds to basic structures other than 'n' basic structures, i.e., unwanted basic structures will remain after the image is developed. Hence, in the case where a negative resist is employed as a resist film, the pad erasing mask has windows that surround pad forming regions of basic structures other than 'n' basic structures. In addition, in the case where a positive resist is employed, there is employed a mask having a pattern such that the pad forming regions on the basic structures other than the 'n' basic structures are covered portions. As a result, the obtained pad forming resist pattern plays a role as a lift-off mask that can form pads on only regions of the inter-layer insulating film on the 'n' basic structures. When a material which composes a pad is vapor-deposited by this mask, the first to third contract holes formed each in the inter-layer insulating film on 'n' basic structures are filled, and the gate pad, source pad, first drain pad, and second drain pad are formed, respectively. Therefore, an unwanted basic structure, gate pad, source pad, and first drain pad are not electrically connected to each other. Thus, in the semiconductor device to be fabricated, the number of effective unit FETs is 'n'. In this manner, a desired drain current value can be obtained.

Exposure of the aforementioned resist film is carried out by two-step exposure with first exposure employing a pad pattern mask and second exposure employing a pad erasing mask. In this manner, each of the pads that are electrically connected to the effective 'n' basic structures can be formed on these structures. In addition, the first and second exposures can obtain a pad forming resist pattern irrespective of which exposure is carried out first.

The step of forming a pad (6) may comprise the following sub-steps of:

(6-(1)) forming a resist film on an inter-layer insulating film;

(6-(2)) forming a pad forming resist pattern to be developed after the resist film has been developed by employing a pad pattern mask that has a pattern of the gate pad, source pad, first drain pad, and second drain pad; and a slit pattern mask that separates a region on 'n' basic structures and a region on non-'n' basic structures; and (6-(3)) forming the gate pad, source pad, first drain pad, and second drain pad by means of the lift-off method employing this pad forming resist pattern.

When a resist film is subjected to exposure by employing a pad pattern mask, a pattern latent image of the regions for 'm' basic structures is formed in the resist film. In addition, when a slit pattern mask is employed for this resist, if positioning is carried out on non-'n' basic structures so that a slit pattern latent image is positioned between a region of 'n' basic structures and a region of non-'n' basic structures, and then, exposure is carried out, the resist pattern obtained after being developed has a structure such that a pad pattern is divided into a pad pattern that covers the top of 'n' basic structures and a pad pattern that covers the top of basic structures other than the 'n' basic structures. In the case where a negative resist is employed as a resist film, a slit pattern mask is a mask in which a dividing portion is a window. In addition, in the case where a positive resist is employed as a resist film, a slit pattern mask is a mask in which a dividing portion is a covered portion. The thus obtained pad forming resist pattern includes two masks, i.e., a mask for forming each pad in the region of the inter-layer insulating film on 'n' basic structures and a mask for forming each pad in the region of the inter-layer insulating film on non-'n' basic structures. Thereafter, when a material of which the pad is composed is vapor-deposited by employing this mask, the first to third contact holes formed respectively in the inter-layer insulating film on 'n' basic structures are filled, and the gate pad, source pad, first drain pad, and second drain pad are formed, respectively. In addition, on the unwanted basic structures other than the 'n' basic structures as well, the contact hole formed respectively in the inter-layer insulating film is filled, and each of the pads which are continuous with this film is respectively formed. However, since the region of 'n' basic structures is not electrically connected to that of the unwanted basic structures, 'n' unit FETs can be operated effectively in the semiconductor device to be fabricated. Hence, a desired drain current value is obtained. In addition, unwanted unit FETs can also be operated as FETs by applying a voltage to the gate pad, source pad, and drain pad. In this manner, instead of adjusting the number of unit FETs in order to obtain a desired drain current value, a dividing position is selected or a plurality of parts are divided, thereby making it possible to determine the gate width dependency of the FET characteristics in one FET chip.

In addition, exposure of the aforementioned resist film is carried out by a two-step exposure with the first exposure employing a pad pattern mask and the second exposure employing a slit pattern mask. In this manner, each of the pads that are electrically connected to these structures can be formed on effective 'n' basic structures. Even on unwanted basic structures, each pad can be formed each in a state in which each pad is electrically disconnected from the pad formed on the 'n' basic structures. Either of the first and second exposures may be performed first.

A method that differs from the above two methods of fabricating a semiconductor device having a structure in which a plurality of unit FETs are arranged in a line comprises the following steps.

First, as in the steps (1) and (2) of the above two methods, the basic structure of the unit FET is formed on 'm' active layer regions formed on the substrate. This method further comprising the steps of:

(III) dividing 'm' basic structures by 'x' unit FET blocks composed of a plurality of basic structures, thereby determining the number 'y' of unit FET blocks in which a desired drain current value is obtained;

(IV) forming an inter-layer insulating film on the 'x' unit FET blocks;

(V) forming the first to third contact holes that correspond to 'm' basic structures on the inter-layer insulating film;

(VI) forming a gate pad in the first contact hole and on the inter-layer insulating film in unit FET blocks, forming a source pad in the second contact hole and on the inter-layer insulating film in unit FET blocks, forming a first drain pad in the third contact hole and on the inter-layer insulation pad, thereby forming the second drain pad in unit FET blocks on the inter-layer insulating film, the second drain pad being spaced apart from the first drain pad; and (VII) forming a wiring between the first pads that connects a first drain pad and a second drain pad to each other, and forming a wiring between the second pads for coupling 'y' gate pads of the 'x' pads, source pads, and second drain pads, respectively, provided that the above 'x' and 'y' are 0<m, 0<x, y<m, and y<x.

In this manner, 'x' unit FET blocks having at least two unit FETs are formed. 'y' unit FET blocks of the 'x' blocks are electrically connected through a wiring between the second pads. In the semiconductor device to be fabricated, thus, each of the FETs in these 'y' unit FET blocks can be effectively operated. In addition, in the unwanted unit FET blocks of the 'x' blocks as well, the gate pad, source pad, and drain pad are formed, and therefore, a voltage is applied to each of these pads, whereby the pads can be operated as FETs. Hence, instead of adjusting the number of unit FET blocks in order to obtain a desired drain current value, a number of electrically connected FETs which employ this adjustment method and have varying numbers of blocks are formed, thereby making it possible to determine the gate width dependency of the FET characteristics in one FET chip.

By electrically connecting 'y' unit FET blocks of the 'x' blocks through wiring between the second pads, each pad is formed by each unit FET block, and then, a resist film is formed on this structure. Then, the two-step exposure is carried out by exposure employing a mask having a wiring pattern in which the wire connects the first pads to each other and a mask having a wiring pattern in which the wire connects the second pads to each other and with exposure employing a mask having a pattern for erasing wiring in which the erasing wiring connects the second pads of unit FET blocks other than 'y' unit FET blocks to each other. Subsequently the resist film which is formed is developed, and a resist pattern is thereby formed. Then, after a wiring material has been vapor-deposited on the resist pattern, the resist pattern is removed. In this manner, the pads in 'y' unit FET blocks can be connected to each other. In addition, the first pad wiring between the first drain pad and the second drain pad is formed. This first pad wiring may be air bridge wiring. In this case, for example, a resist pattern is formed between the first drain pad and the second drain pad so as to be a pillow. Next, the first drain pad and the second drain pad are provided via the top surface of the pillow, and a wiring material is formed. Thereafter, the above resist pattern is removed, and an interval between the first drain pad and the second drain pad can thereby be bridged by the first pad wiring without being brought into contact with another region between the first and second drain pads.

As is evident from the foregoing description, according to the method of fabricating the semiconductor device of the present invention, the number of the unit FETs in which a desired drain current value is obtained is first designed in advance. This fabricating method comprises the steps of:

(1) forming 'm' active layer regions more than the number of the designed unit FETs so as to be arranged in a line on a substrate;

(2) the step for forming a gate electrode, a source electrode, and a drain electrode, respectively, on each region of the 'm' active layer regions, thereby forming a basic structure of 'm' unit FETs;

(3) predicting a drain current value of the semiconductor device from the value obtained by measuring the drain current value of each of the basic structures, and comparing this predicted value with a desired drain current value, thereby determining the number 'n' of basic structures in which a desired drain current value is obtained;

(4) forming an inter-layer insulating film on the basic structure; and (5) simultaneously forming a first contact hole that penetrates this inter-layer insulating film to expose a part of the surface of the gate electrode; a second contact hole that penetrates the inter-layer insulating film to expose a part of the surface of the source electrode; and a third contact hole that penetrates the inter-layer insulating film to expose a part of the surface of the drain electrode.

Forming the first to third contact holes, that is step (5), is carried out for only a region on 'n' basic structures of the inter-layer insulating film, provided that $m \geq n$ and m, n>0.

At a time when a basic structure of the unit FET is formed, when this basic structure is employed as a TEG-FET, thereby measuring a drain current value, the number 'm' of the basic structures is more than the number of the unit FETs that has been designed in advance. Thus, a drain current value higher than a desired drain current value is obtained. In the case where the number of basic structures is the same as the number of FETs that has been designed in advance, if an error occurs in any of the steps of forming a basic structure, shortage occurs with the drain current value of the obtained basic structure, and this shortage cannot be compensated for during the subsequent steps. As a result, the basic structure cannot be produced as a FET. In contrast, as described above, when the number of basic structures is more than the number of FETs that has been designed in advance, there is no risk that shortage occurs with the drain current value of the basic structure. In the fabricating method according to the present invention, although the drain current value of the semiconductor device predicted from the drain current value by each of the drain current value of the basic structure is higher than a desired value, this value can be adjusted to be a desired value during the subsequent steps. The required number 'n' of basic structures in the structures being fabricated is determined based on the predicted value and desired value of the drain current. Hence, the step (5) of forming an inter-layer insulating film on a basic structure, and then, forming the first to third contact holes so that a part of each basic structure is subjected to exposure to the inter-layer insulating film is carried out for only a region of the inter-layer insulating film on the determined 'n' basic structures. In this manner, non-'n' basic structures are not elements that operate in the semiconductor device to be fabricated. Hence, the semiconductor device in which desired drain characteristics are obtained can be fabricated with high yield.

BRIEF DESCRIPTION OF DRAWINGS

FIGS. 6A and 6B are views illustrating the second and third embodiments, wherein FIG. 6A is a schematic view showing a configuration of a pad pattern mask, and FIG. 6B is an enlarged view of essential parts of the pad pattern mask.

FIG. 8 is a schematic pattern perspective view of the semiconductor device, illustrating the third embodiment.

DETAILED DESCRIPTION OF THE PREFERRED EMBODIMENT

Hereinafter, embodiments of the present invention will be described with reference to the accompanying drawings. The drawings merely schematically show a relationship of the shape, size, and location of each constituent component to an extent that one can understand the invention, and therefore, the present invention is not limited to the embodiments illustrated. In addition, partial regions of plan views are hatched (shaded) for emphasis and clarity.

<First Embodiment>

Figure 1:
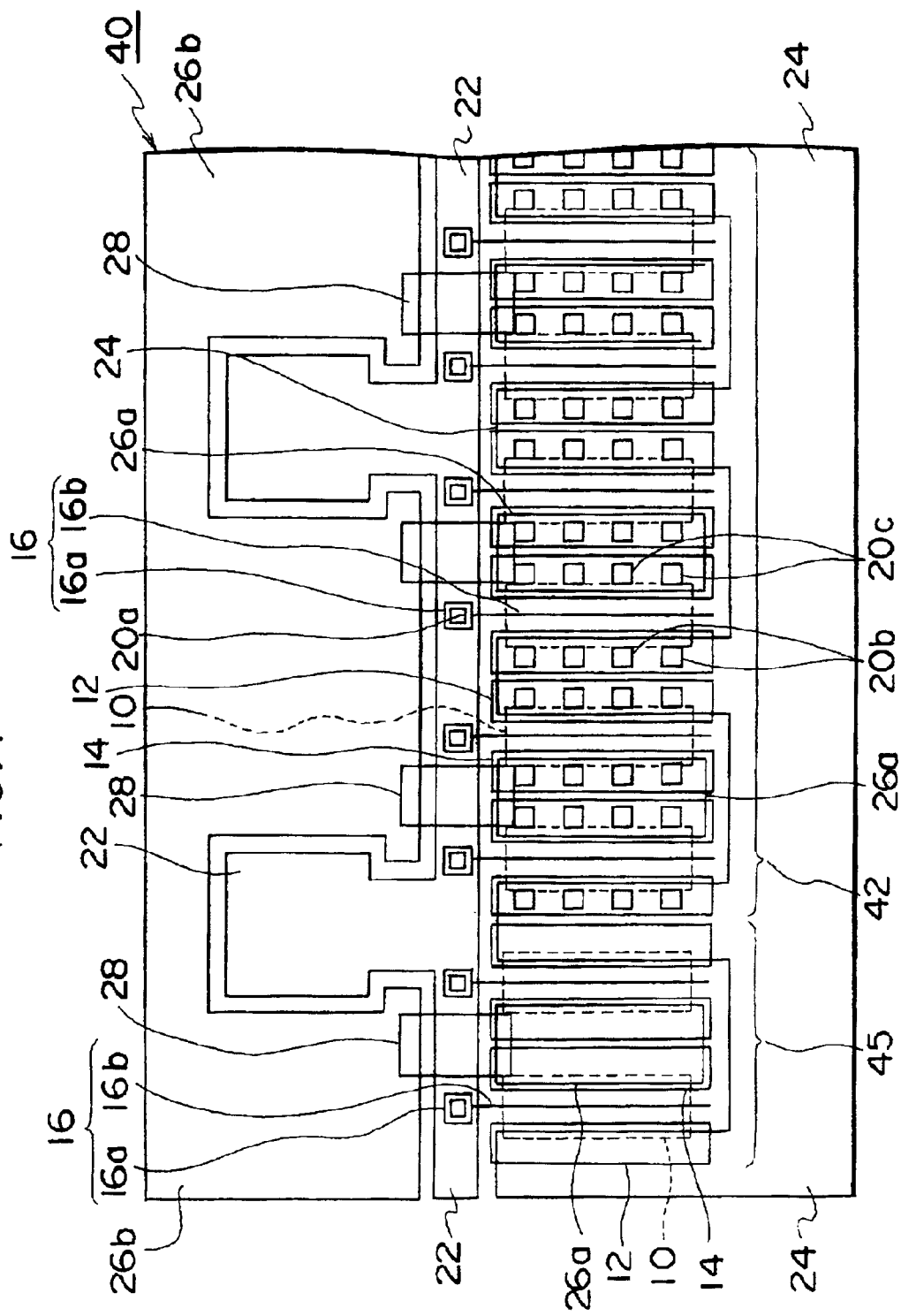
FIG. 1 is a schematic pattern perspective view of a semiconductor device, illustrating a first embodiment.
Figure 2:
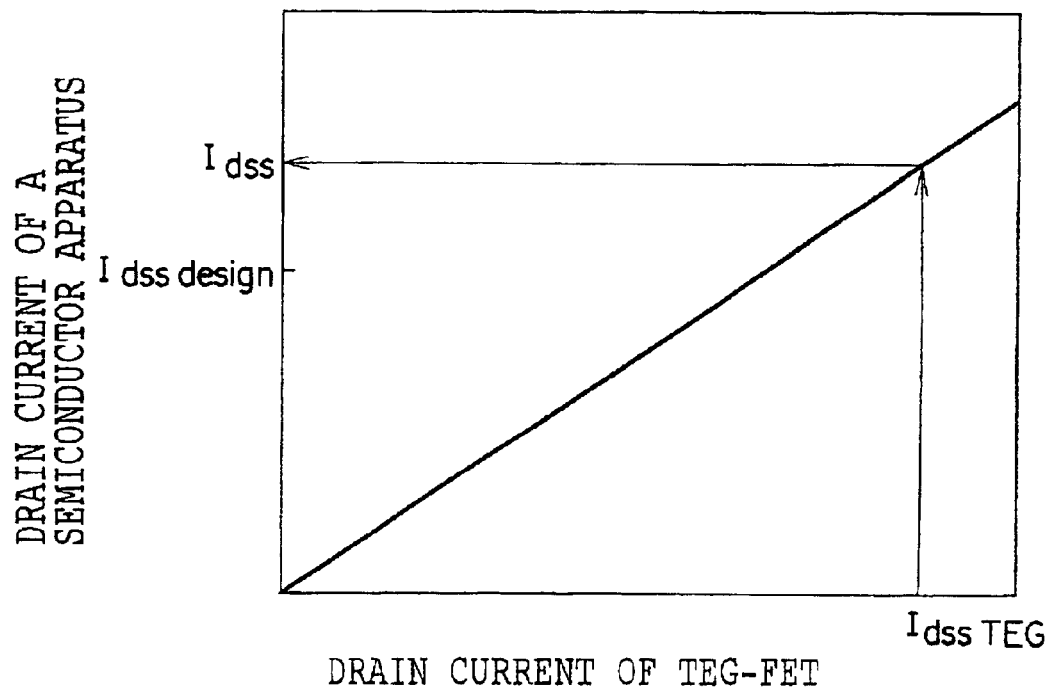
FIG. 2 is a characteristic chart showing a relationship between a drain current value of a TEG-FET and a drain current value of the semiconductor device to be fabricated.
Figure 3A:
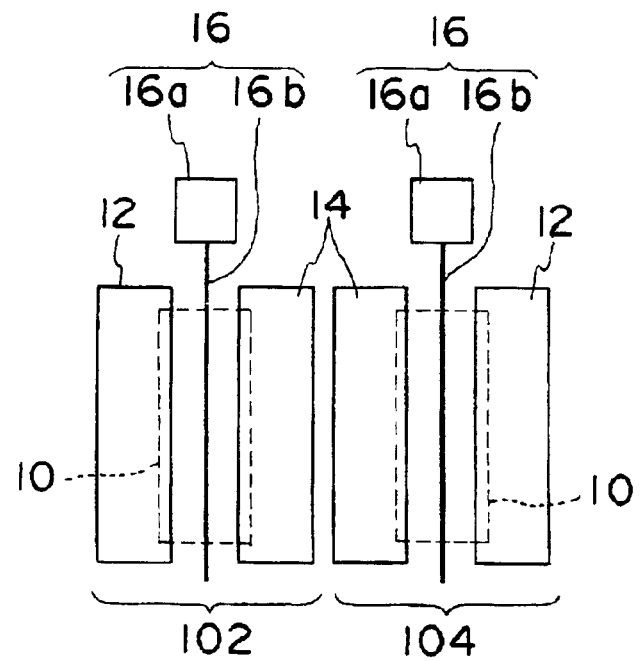
FIGS. 3A–3D are partial plan views showing the steps of fabricating the semiconductor device.
Figure 3B:
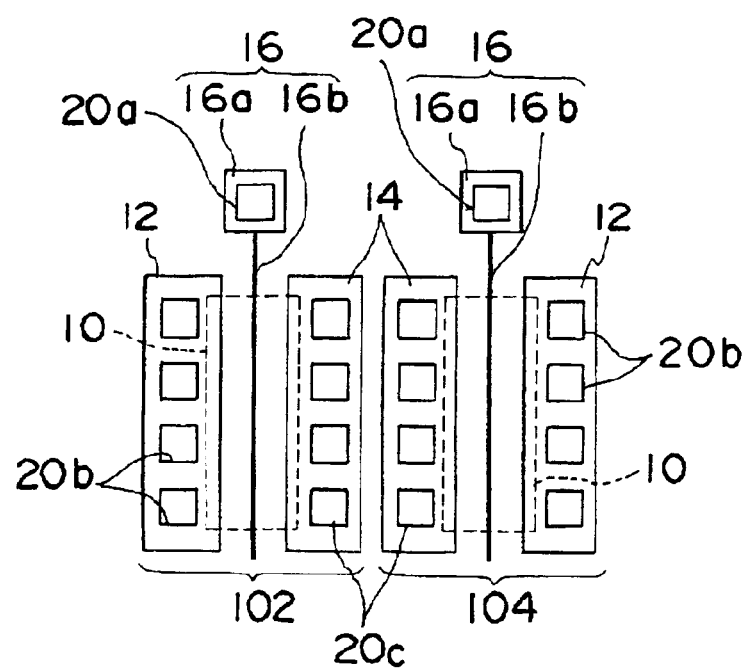
Figure 3C:
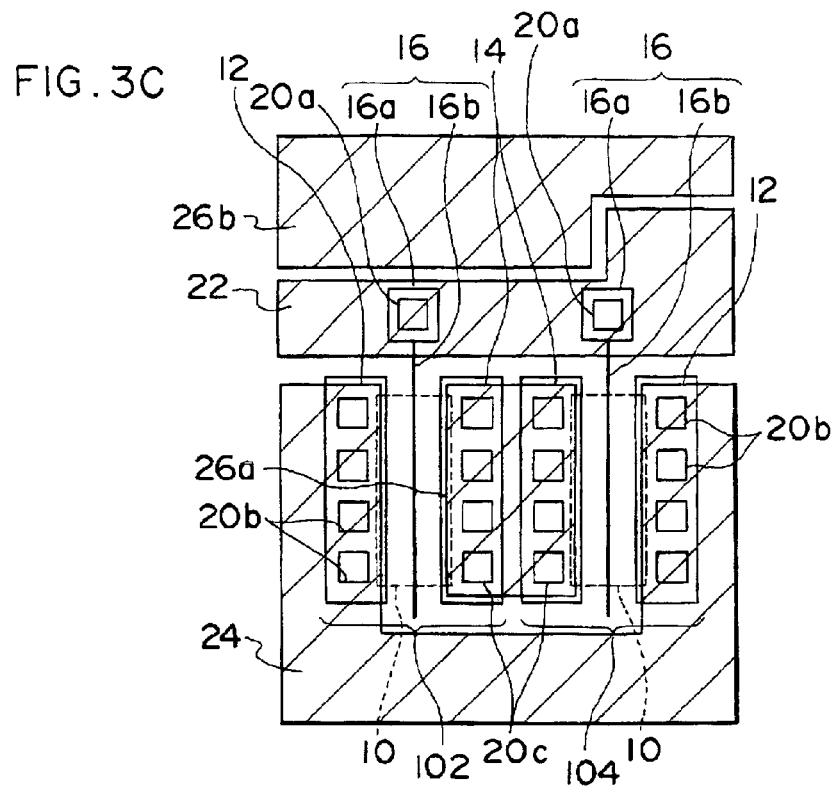
Figure 3D:
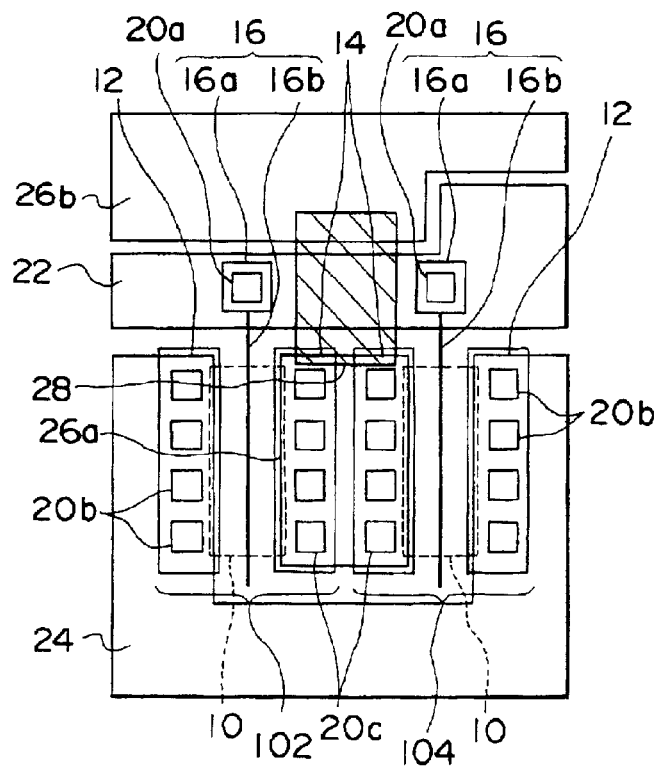
Figure 4A:
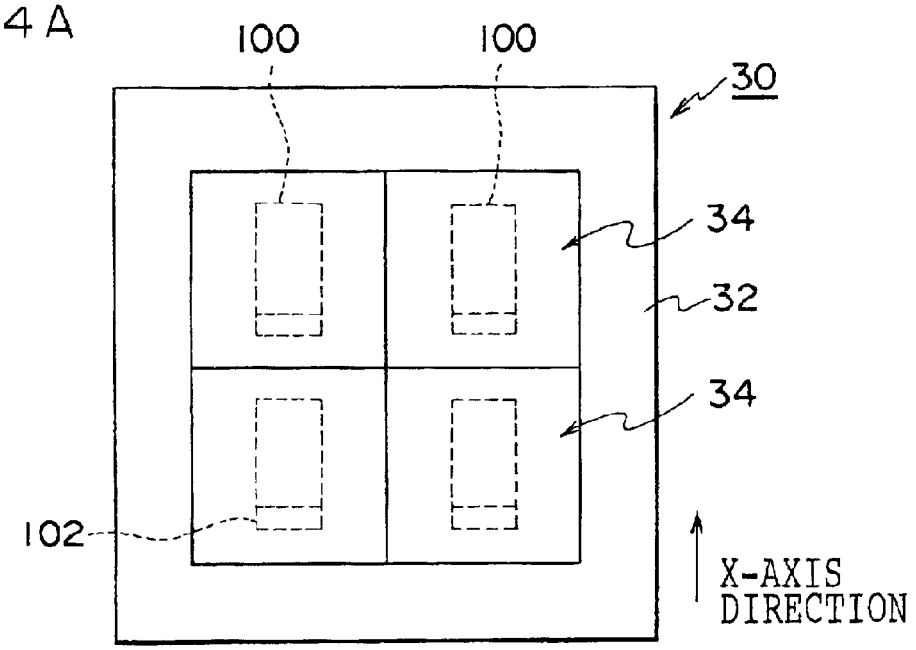
FIG. 4A is a schematic view of a mask employed for exposure.
Figure 4B:
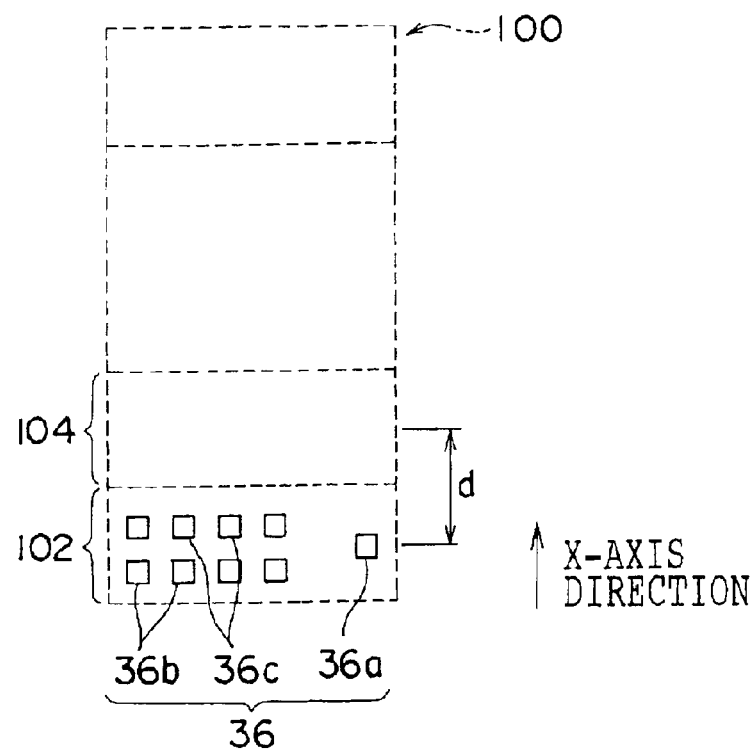
FIG. 4B is a partially exploded view of the mask.

As a first embodiment, one of the preferred examples of a method of fabricating a semiconductor device according to the present invention will be described with reference to FIGS. 1–2, FIGS. 3A–3D, FIGS. 4A–4B, and FIGS. 14A–14E by using a GaAs recess gate FET as an example. FIG. 1 is a pattern perspective view of a semiconductor device (FET chip) according to the first embodiment when viewed from the top. FIG. 2 is a characteristic chart showing a relationship between a drain current value of a TEG-FET and a drain current value of a semiconductor device to be fabricated. FIGS. 3A–3D are partial plan views showing the steps of fabricating the semiconductor device. FIG. 4A is a schematic view of a mask employed for exposure, and FIG. 4B is a partially enlarged view of the mask.

First, 'm' active layer regions which are more than the number of designed unit FETs are formed so as to be arranged in a line on a substrate.

Figure 14A:
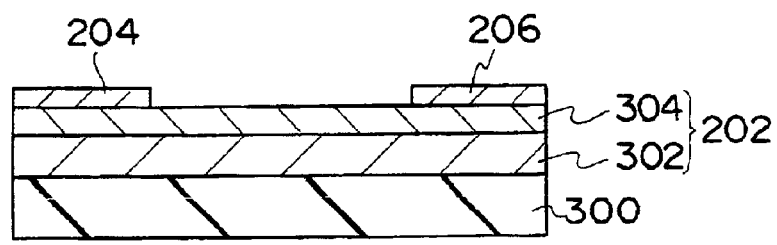
FIGS. 14A–14E are views of the steps of fabricating the basic structure of unit FETs, illustrating prior art and the embodiments of the present invention.
Figure 14B:
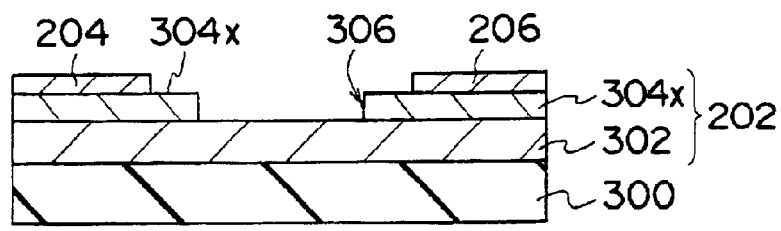
Figure 14C:
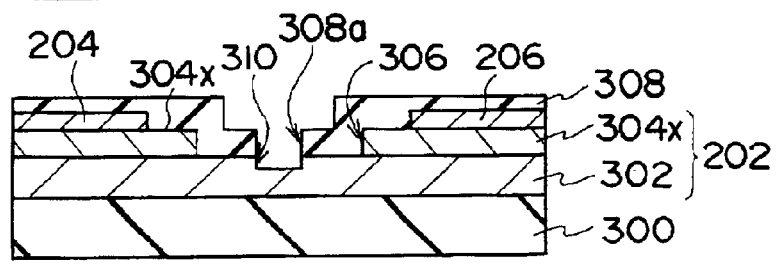

Here, as is in the conventional method, an active layer 202 including an n-type channel layer 302 and an n+ contact layer 304 is formed on a semi-insulating GaAs substrate 300 by means of an epitaxial technique, for example (refer to FIG. 14A). Thereafter, a resist pattern that covers 'm' regions on the active layer 202 is formed, and then, a region of the active layer subjected to exposure from the resist pattern is removed by means of etching. Then, the resist pattern is removed, to thereby form 'm' active layer regions 10 (FIG. 1).

Next, a gate electrode 16, a source electrode 12, and a drain electrode 14 are formed on the upper side of each region of 'm' active layer regions 10, and a basic structure 100 of 'm' unit FETs is formed.

Figure 14D:
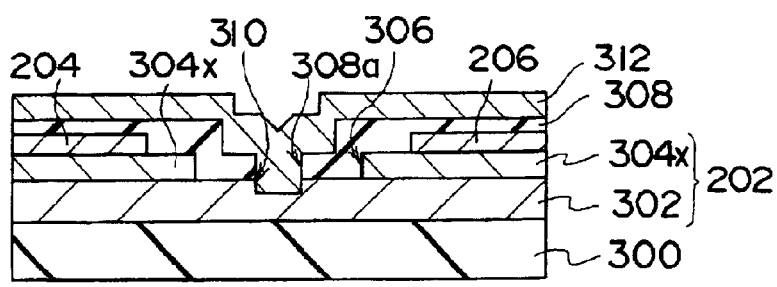
Figure 14E:
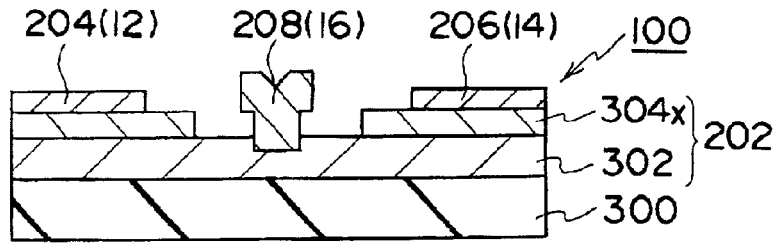

Here, as is in the conventional method, the source electrode 12 (204) and the drain electrode 14 (206) are formed on each region of the active layer region 10 by employing an electrode material composed of AuGe, Ni, and Au (refer to FIG. 14A). Thereafter, a SiO$_2$ mask having an opening on the active layer region 10 that includes these electrodes 12 (204) and 14 (206) is provided, and then, a region of the n+ contact layer 304 is etched and removed by employing this mask. In this manner, a wide recess 306 that exposes a region of the n-type channel layer 302 is formed (refer to FIG. 14B). Thereafter, an SiO$_2$ film is further formed on the active layer region 10 that includes the inside of the wide recess 306, an opening 308a having an opening diameter smaller than the wide recess 306 is provided on this film, and a mask 308 is formed. Etching is carried out by employing this mask 308, and a narrow recess 310 in which a part of the n-type channel layer 302 has been removed is formed in the wide recess 306 (refer to FIG. 14C). Next, a gate metal 312 is deposited by spattering on the entire surface of the structure, and the gate metal 312 is embedded in the narrow recess 310 (FIG. 14D). Subsequently, the gate metal 312 is formed in a desired shape by employing dry etching, and then, the SiO$_2$ film mask 308 is removed. In this manner, the basic structure 100 of 'm' unit FETs is obtained (refer to FIG. 14E). FIGS. 3A and 3B are plan views of this structure when viewed from the top. In FIG. 3A, there are shown two adjacent basic structures 100 (102 and 104). The basic structures 102 and 104 shown in FIG. 3A comprise an active layer region 10, a source electrode 12, a drain electrode 14, and a gate electrode 16, respectively. The gate electrode 16 is composed of an electrode section 16a and a gate finger 16b.

Next, a drain current value of the semiconductor device is predicted from the value obtained by measuring the drain current value of each of the basic structures; this predicted value is compared with a desired drain current value, and the number 'n' of basic structures in which a desired drain current value is obtained is determined.

Here, one of the above 'm' basic structures 100 is employed as a TEG-FET, and the drain current value of this TEG-FET is measured.

First, in FIG. 2, there is shown a correlation between a drain current value of the TEG-FET and a drain current value of the FET of the fabricated semiconductor device. A correlation between the drain current of this TEG-FET and the drain current of the FET device (semiconductor device) after being fabricated is predetermined by the values obtained by measuring the drain current value at the time of fabricating the basic structure and the drain current value after fabricating, of the semiconductor device having the same structure as that fabricated at the steps similar to the above. The straight line shown in FIG. 2 shows a relationship between the drain current value of the TEG-FET of the semiconductor device fabricated with a structure similar to that of the illustrated embodiment and steps similar to the above, and the drain current value of the semiconductor device obtained finally. Here, in the case where the drain current value of the TEG-FET formed through the above steps is $I_{dssTEC}$, for example, the drain current value of the semiconductor device to be fabricated is read as $I_{dss}$, and is predicted using the straight line of FIG. 2 corresponding to the value ($I_{dssTEG}$). The desired value of the drain current value of the semiconductor is $I_{dss\ design}$. The drain current value is a value that depends on the FET gate width. A total number of the gate widths of the semiconductor device is a gate width of one unit FET times the number of unit FETs. The number 'n' of minimum unit FETs that satisfies the equation, $1_{dss} \times n/m \geq I_{dss}$ design (m, n>0, m≥n) can be obtained.

Next, an inter-layer insulating film is formed on the basic structure 100 (not shown).

Here, the inter-layer insulating film is formed on the entire upper surface of the substrate.

Next, there is formed simultaneously a first contact hole that penetrates an inter-layer insulating film and exposes a part of the surface of the gate electrode; a second contact hole that penetrates the inter-layer insulating film and exposes a part of the surface of the source surface; and a third contact hole that penetrates the inter-layer insulating film and exposes a part of the surface of the drain electrode. However, forming these first to third contact holes is carried out for only a region on the above determined 'n' basic structures in the inter-layer insulating film.

Figure 5:
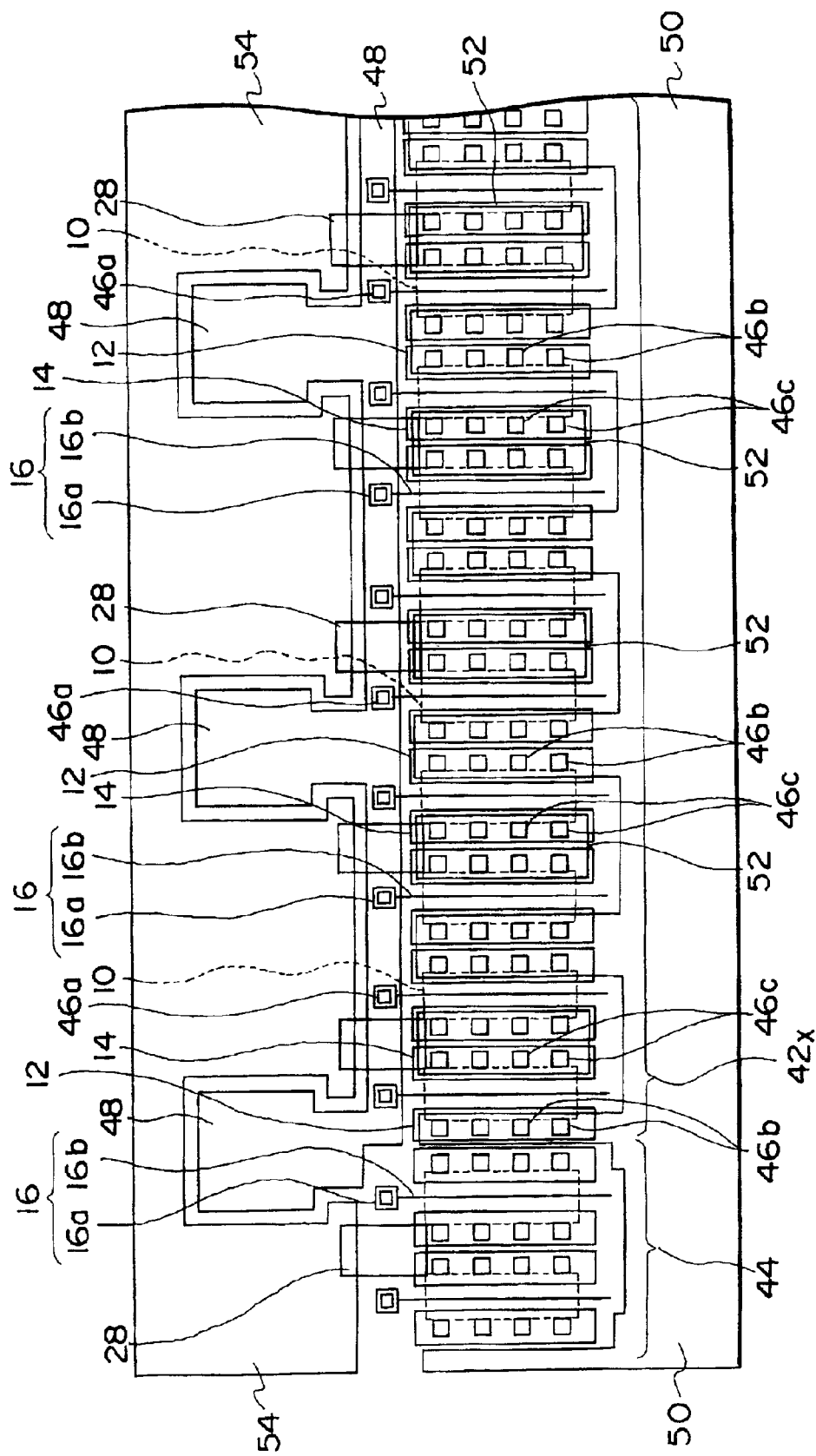
FIG. 5 is a schematic pattern perspective view of the semiconductor device, illustrating a second embodiment.

First, a resist film is formed on the inter-layer insulating film. Then, the resist film is subjected to exposure and developed by employing a mask in which there is provided a window pattern that corresponds to the first to third contact holes formed in the region of the inter-layer insulating film by each of the basic structures. FIG. 5 shows an example of a mask (reticle) for contact hole exposure. FIG. 4A is a schematic configuration of a mask, and FIG. 4B is a partially enlarged view of the mask. By referring to FIG. 4A, the size and configuration of a mask 30 is such that exposure can be carried out simultaneously for four regions on 'm' basic structures 100. In a reticle frame 32, there are provided four exposure regions 34 for causing exposure of the resist film on 'm' basic structures 100. In each of these four regions 34, a window pattern 36 for forming the first to third contact holes for a portion of the resist film is formed on one of the basic structures 100 (FIG. 4B). As the window pattern 36, there are formed a first contact hole window pattern 36a; a second contact hole window pattern 36b; and a third contact hole pattern 36c. By employing this mask 30, exposure is first carried out for a region of the resist film on one basic structure 102 positioned at the most distant end. When an interval between the adjacent basic structures 104 in the x-axis direction is defined as 'd', the structure is displaced so that the mask pattern is set at a position shifted by 'd' in the x-axis direction. Thereafter, second exposure is carried out to form a pattern latent image of the contact holes in the region of the resist film on the second basic structure 104 of the 'm' structures. Similarly, a contact hole pattern latent image is also formed in a region of the resist film on the third basic structure, and this step is repeated 'n' times, whereby the first to third contact hole patterns are formed, respectively, in the regions of the resist films on 'n' basic structures. Thereafter, a developing process is carried out, thereby forming a resist pattern. Then, this resist pattern is employed as a mask, and the first to third contact holes 20a, 20b, and 20c are formed for the inter-layer insulating film by means of RIE or the like, for example. Thereafter, a resist pattern is removed (FIG. 1 and FIG. 3B).

As in the conventional method, first wirings 22, 24, 26a, and 26b are formed so as to embed the first to third contact holes 20a to 20c. In this manner, a gate pad 22 that fills the first contact hole 20a, and that is electrically connected to the gate electrode 16 is formed. Then, a source pad 24 that fills the second contact hole 20b, and that is electrically connected to the source electrode 12 is formed. Then, a first drain pad 26a that fills the third contact 20c, and that is electrically connected to the drain electrode 14 is formed. Further, a second drain pad 26b is formed apart from the first drain pad 26a at a position so that the first drain pad 26a and the second drain pad 26b sandwich the gate pad 22 (FIG. 1 and FIG. 3C).

As in the conventional method, as a second wiring 28, there is formed an air bridge wiring 28 that connects the first drain pad 26a and the second drain pad 26b to each other (FIG. 1 and FIG. 3B). Then, a passivation film is formed on the top surface of the structure, and then, holes for making connection to the gate pad 22, source pad 24, and second drain pad 26b are formed, respectively, in this passivation film. These holes are employed for wiring during mounting (not shown).

As a result, the contact holes 20a to 20c are not formed on the region 45 of the basic structure of 'm'-'n' unit FETs of the basic structures, and thus, are not electrically connected to each of the pads 22, 24, and 26b and another unit FET 42. In this manner, there can be provided a semiconductor device 40 in which 'n' unit FETs 42 as shown in FIG. 1 work effectively. In this manner, a desired drain current value is obtained. In addition, more basic structures of the unit FETs than the predetermined number of the unit FETs are fabricated. Thus, even if a problem occurs during some steps of fabricating the basic structures, the drain current value of the semiconductor device predicted from the drain current value by each of the basic structures being TEG-FETs is higher than a desired drain current value. Hence, it is possible to make adjustment so that a desired drain current value is obtained during the subsequent steps. An adjusting method in this embodiment is such that there is provided a unit FET 42, wherein only 'n' basic structures in which a desired drain current value is obtained operate effectively. That is, contact holes are formed in only the region on 'n' basic structures on inter-layer insulating film on the basic structure. In this manner, in the semiconductor device 40 to be fabricated, 'n' unit FETs 42 are selectively operated, whereby a desired current value can be obtained.

<Second Embodiment>

Figure 6A:
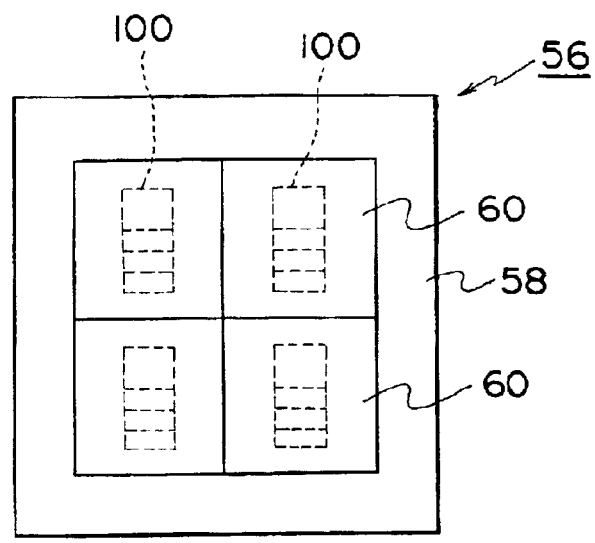
Figure 6B:
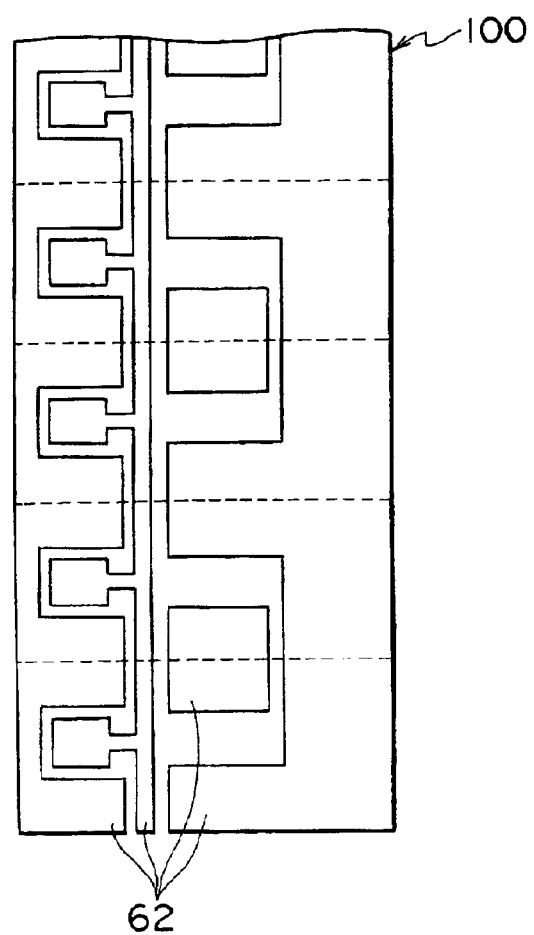
Figure 7A:
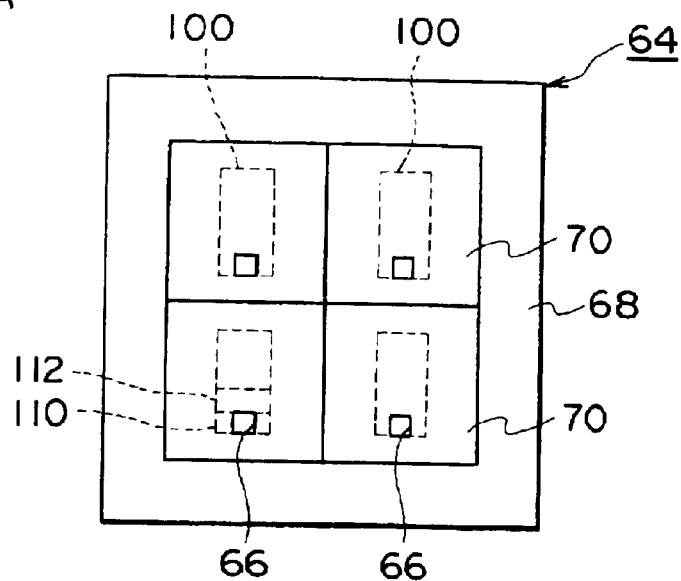
FIG. 7A is a schematic view showing a configuration of a pad erasing mask.
Figure 7B:
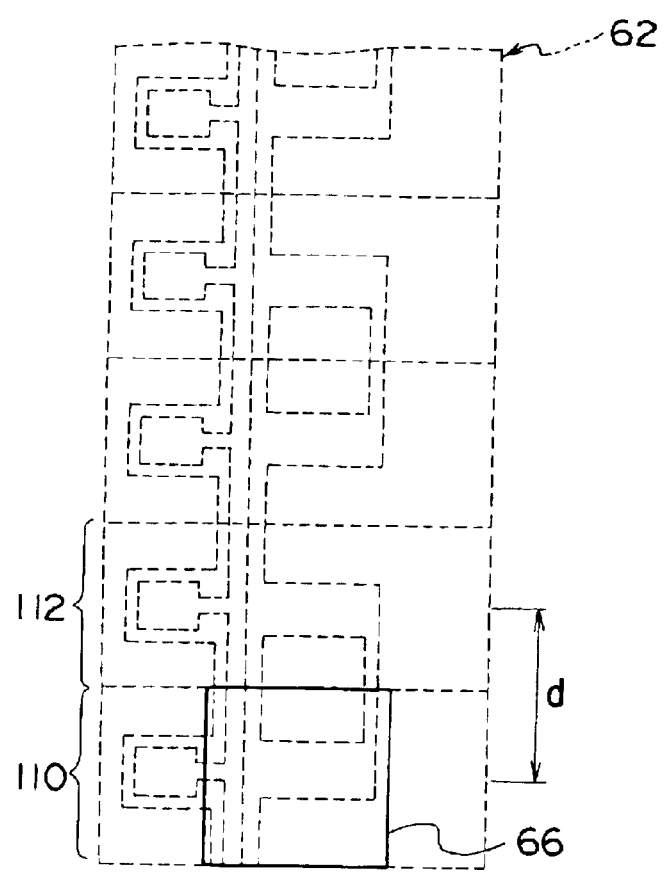
FIG. 7B is an enlarged view of essential parts of the pad erasing mask.

As a second embodiment, another preferred embodiment of a method of fabricating a semiconductor device according to the present invention will be described with reference to FIG. 5, FIGS. 6A–6B, and FIGS. 7A–7B. FIG. 5 is a pattern perspective view of the semiconductor device (FET chip) according to the second embodiment when viewed from the top. FIGS. 6A–6B are plan views each showing a configuration of a pad pattern mask. FIGS. 7A–7B are plan views each showing a configuration of a pad erasing mask.

Hereinafter, only points that differ from the first embodiment will be described, and a detailed description of points similar to the first embodiment will be omitted.

First, as in the first embodiment, 'm' active layer regions 10 are formed so as to be arranged in a line on a substrate, and then, the gate electrode 16, source electrode 12, and drain electrode 14 are formed, respectively, on each region of the 'm' active layer regions 10. In this manner, basic structures 100 of 'm' unit FETs similar to those shown in the first embodiment are formed.

Next, as in the first embodiment, one of the basic structures 100 is defined as a TEG-FET, and its drain current value is measured. The obtained value ($I_{dss\ TEG}$) is fitted on to the straight line shown in FIG. 2, and the drain current value ($I_{dss}$) of the semiconductor device to be fabricated is predicted. From this value ($I_{dss}$) and a desired drain current value ($I_{dss\ design}$), the minimum number 'n' of unit FETs that satisfies the equation, $I_{dss} \times n/m \geq I_{dss\ design}$ (m, n>0, m≧n) is obtained.

Next, an inter-layer insulating film is formed on the basic structure 100.

In this embodiment, as in the conventional method, the first to third contact holes 46a to 46c that penetrate the inter-layer insulating film are formed for the region of the inter-layer insulating film on 'm' basic structures 100.

Next, a gate pad 48 is formed in the first contact hole 46a and on the inter-layer insulating film; a source pad 50 is formed in the second contact hole 46b and on the inter-layer insulating film; a first drain pad 52 is formed in the third contact hole 46C and on the inter-layer insulating film, and a second drain pad 54 is formed on the inter-layer insulating film, the drain pad 54 being spaced apart from the first drain pad 52. However, the step of forming each of these pads is carried out for only the region on the obtained 'n' basic structures.

First, a resist film is formed on an inter-layer insulating film. In this example, the resist film is formed with a negative resist, for example.

Next, the resist film is subjected to exposure by employing a pad pattern mask that has a pattern of the gate pad, source pad, first drain pad, and second drain pad; and a pad erasing mask that has a pattern having a shape which encloses the predetermined pad forming region on non-'n' basic structures, and is developed, and a pad forming resist pattern is thereby formed.

FIGS. 6A–6B are plan views illustrating a shape of a part of the pad pattern mask (reticle) 56 when viewed from the top. As shown in FIG. 6A, the size and configuration of the mask 56 is such that four regions on 'm' basic structures 100 can be subject to simultaneous exposure. Four exposure regions 60 are provided in a reticle frame 58. An island pattern 62 for forming each of the pads provided on 'm' basic structures 100 is formed for each one of these four regions 60. This island pattern 62 is shown in FIG. 6B. The island pattern 62 has a shape that corresponds to the gate pad, the source pad, the first drain pad and the second drain pad. In addition, a configuration of the pad erasing mask 64 is shown in FIGS. 7A–7B. This mask 64 has a window 66 having a size and shape such that the upper side of the active layer region of each unit FET can be subjected to exposure. The mask 64 comprises four exposure regions 70 in a reticle frame 68, and each of the regions 70 has a size and shape such that the region on 'm' basic structures 100 (FIG. 7A) can be subjected to exposure. In FIG. 7B, the shape of the island pattern 62 of the pad pattern mask 56 in FIG. 6B is shown by dotted line. When this island pattern 62 is aligned with the window 66, the window 66 of the pad erasing mask 64 is positioned on the predetermined region for forming each pad of each unit FET.

The above resist film is subjected to exposure by employing the pad pattern mask 56 in FIGS. 7A–7B. In this manner, 'm' pad pattern latent images are formed in the resist film. Next, the resist film is subjected to exposure again by employing the pad erasing mask 64 shown in FIGS. 8A–8B. In the semiconductor device, the required number of unit FETs is 'n', and thus, the pad pattern latent images of unwanted (m−n) unit FETs are erased. Thus, the mask 64 is positioned so that the window 66 of the pad erasing mask 64 shown in FIG. 8 is positioned on the basic structure 110 at the most distant end, and exposure is carried out. In the case where 'm−n' is 1, the exposure then terminates. In the case where 'm−n' is 2 or more, the mask is shifted in a direction of the adjacent basic structures 112, and exposure is further carried out. For example, when an interval between the adjacent basic structures is defined as 'd', the mask 64 may be shifted by 'd'. This operation is carried out repeatedly, and a portion of the pad pattern latent image at the upper side of 'm−n' basic structures is subjected to exposure, and a region that remains after developing is thereby produced. Thereafter, a pad forming resist pattern having a pad pattern that corresponds to 'n' unit FETs is obtained by performing a developing process.

Next, by employing this pad forming resist pattern, the gate pad 48, source pad 50, first drain pad 52, and second drain pad 54 are formed by means of a lift-off method.

Here, Ti/Pt/Au, for example, is vapor-deposited as a pad forming material on the pad forming resist pattern. Then, a pad forming resist pattern is removed, and the gate pad 48, the source pad 50, and the first and second drain pads 52 and 54 are thereby formed (FIG. 5).

Thereafter, as in the first embodiment, an air bridge wiring 28 that connects the first drain pad 52 and the second drain pad 54 to each other is formed. A passivation film is formed on the top surface of the structure, and then, a hole for connecting each pad is formed in this passivation film (not shown).

As a result, there is provided a semiconductor device in which 'n' unit FETs work effectively (FIG. 5). In this manner, a desired drain current value is obtained. In addition, more basic structures of the unit FETs are fabricated than the predetermined number of the unit FETs. Thus, even if a problem occurs with some steps of fabricating the basic structures, the drain current value of the semiconductor device predicted from the drain current value by each of the basic structures which are TEG-FETs is higher than such desired drain current value. Hence, it is possible to make an adjustment so that a desired drain current value is obtained. The adjusting method in this embodiment is such that there is provided a unit FET, wherein only 'n' basic structures in which a desired drain current value is obtained operates effectively during the subsequent steps. That is, the gate pad 48, the source pad 50, and the drain pads 52 and 54 are formed partially only on a region 42x of 'n' basic structures. In this manner, these pads are not formed on a region 44 of 'm−n' basic structures, and the basic structure are not electrically connected to these pads. Thus, they are no longer elements that operate in the fabricated semiconductor device.

<Third Embodiment>

Figure 9A:
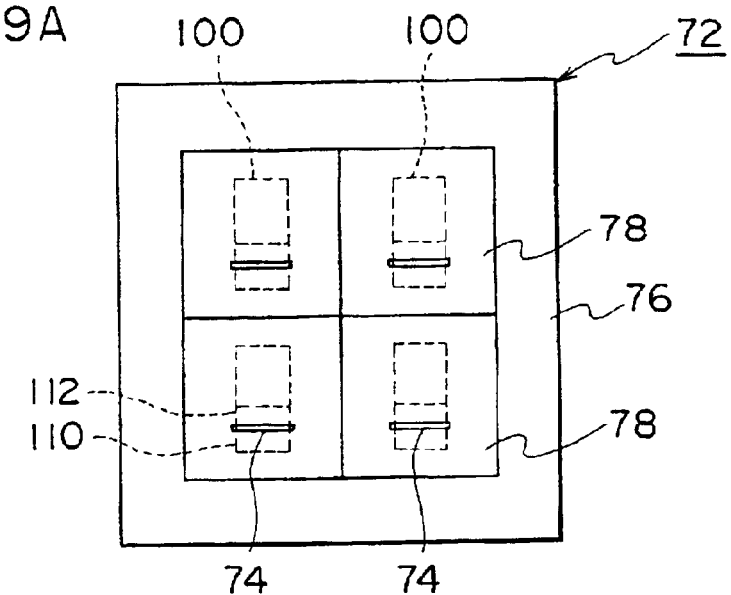
FIG. 9A is a schematic view showing a configuration of a slit pattern mask.
Figure 9B:
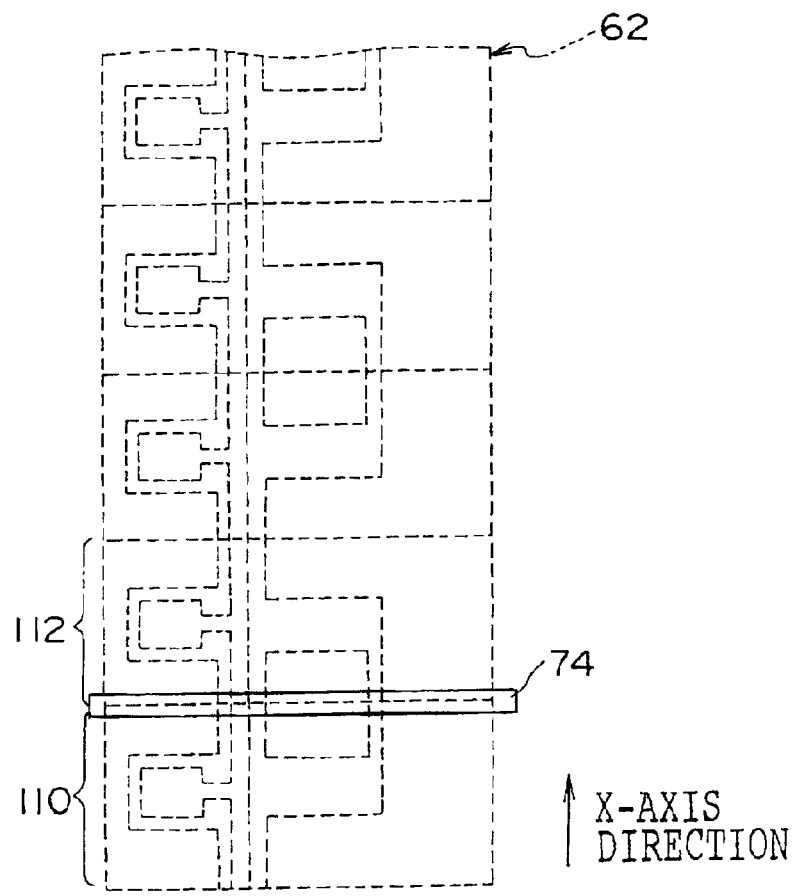
FIG. 9B is an enlarged view of essential parts of the slit pattern mask.

As a third embodiment, a method of fabricating a semiconductor device according to the present invention will be described with reference to FIG. 8 and FIGS. 9A–9B, by way of example in which the steps of forming the pad on the inter-layer insulating film differ from those according to the second embodiment. Hereinafter, the points different from those according to the second embodiment will be described, and a detailed description of the points similar to the second embodiment will be omitted. FIG. 8 is a pattern perspective view of a semiconductor device (FET chip) according to the third embodiment when viewed from the top. FIGS. 9A–9B are plan views each showing a configuration of a slit pattern mask.

First, as in the first and second embodiments, a basic structure 100 of 'm' unit FETs is formed on 'm' active layer regions 10 formed so as to be arranged in a line on a substrate.

Next, one of the basic structures 100 is employed as a TEG-FET; a drain current value ($I_{dss\ TEG}$) is measured; this value is fitted on to the straight line shown in FIG. 2 as in the first and second embodiments; and the drain current value ($I_{dss}$) of the semiconductor device to be fabricated is predicted. From this value and the desired drain current value ($I_{dss\ design}$), the minimum number 'n' of basic structures that satisfies the equation $I_{dss} \times n/m \geq I_{dss}$ design (m, n>0, m≧n) is obtained.

Next, an inter-layer insulating film is formed on the basic structure 100, and then, the first to third contact holes 46a to 46c that penetrate this inter-layer insulating film are formed for the region of the inter-layer insulating film on 'm' basic structures 100.

Thereafter, a gate pad is formed in the first contact hole 46a and on the inter-layer insulating film; a source pad is formed in the second contact hole 46b and on the inter-layer insulating film; a first drain pad is formed in the third contact hole 46c and on the inter-layer insulating film, and a second drain pad is formed on the inter-layer insulating film, the second drain pad being spaced apart from the first drain pad.

In forming these gate pad, source pad, first drain pad, and second drain pad, a resist film is first formed on the inter-layer insulating film. In this example, a negative resist, for example, is employed as a material of the resist film.

Next, the resist film is subjected to exposure by employing a pad pattern mask 56 (refer to FIGS. 6A–6B) that has an island pattern 62 corresponding to the above pad shape; and a slit pattern mask 72 (FIGS. 9A–9B) that separates a region 42x of 'n' basic structures and a region 44 of non-'n' (m−n) basic structures. The resist film is developed, thereby forming a resist pattern for pad formation.

In this embodiment, the pad pattern mask 56 is similar to a mask 56 shown in FIG. 7 as described in the second embodiment. In addition, in FIGS. 9A–9B, there is shown a configuration of a slit pattern mask 72. By referring to the shape of the island pattern 62 of FIG. 6B as shown in FIG. 9B by dotted lines, the slit shaped window 74 has a shape such that the island pattern 62 of the resist film provided on the basic structure is divided by the basic structure. In FIG. 9B, the region of the basic structure 110 is separated from the region of the adjacent basic structure 112 in the x-axis direction by this slit pattern 74. This mask 72 also has an exposure region 78 that makes it possible to carry out four exposures for 'm' basic structures 100 in the reticle frame 76 (FIG. 9A).

First, a resist film is subjected to exposure by employing a pad pattern mask 56, and 'm' pad pattern latent images are formed on the resist film. Then, the resist film is subjected to exposure again by employing a slit pattern mask 72 shown in FIG. 10. Here, exposure is carried out when the mask slit pattern (window) 74 is shifted from the region on the basic structure at the most distant end of the 'm' regions by unwanted 'm−n' unit FET regions. Then, a developing process is carried out whereby, a pad forming resist pattern having the slit shaped remaining pattern is obtained between a pad pattern that corresponds to the region 42x of 'n' basic structures and a pad pattern that corresponds to the region 44 of 'm−n' basic structures.

Next, by employing a pad forming resist pattern, the gate pad, the source pad, the first drain pad, and the second drain pad are formed by the lift-off method.

Here, as in the second embodiment, a pad forming material is vapor-deposited on a pad forming resist pattern. Then, the pad forming resist pattern is removed, and a common gate pad $48x$, a source pad $50x$, and a second drain pad $54x$ that are connected to 'n' basic structures are thereby formed. In addition, a first drain pad $52x$ is formed on the drain electrode 14 of the adjacent two basic structures. Further, pads $48y$, $50y$, $52y$, and $54y$ each connected to 'm-n' basic structures are also formed. However, these pads are not electrically connected to the pads $48x$, $50x$, $52x$, and $54x$ each provided on 'n' basic structures (FIG. 8).

Thereafter, an air bridge wiring 87 that connects the first drain pad $52x$ ($52y$) and the second drain pad $54x$ ($54y$) to each other is formed. The air bridge 87 is independently provided on one drain electrode 14 (FIG. 8). Then, a passivation film is formed on the top surface of the structure, and then, a hole for making connection to each pad is formed in this passivation film (not shown).

As a result, there is provided a semiconductor device in which 'n' unit FETs work effectively. Hence, a desired drain current value is obtained. In addition, more basic structures of the unit FETs are fabricated than the predetermined number of unit FETs. Thus, even if a problem occurs with some steps of fabricating the basic structures, the drain current value of the semiconductor device predicted from the drain current value by each basic structure which is a TEG-FET is higher than a desired drain current value. Hence, it is possible to make adjustment so that the desired drain current value is obtained during the subsequent steps. The adjusting method in this embodiment is such that there is provided a unit FET, wherein only 'n' basic structures in which a desired drain current value is obtained work effectively. That is, due to a slit, a common gate pad, a common source pad, and a common drain pad are formed to be divided into the common pads $48x$, $50x$, $52x$, and $54x$ which are electrically connected to 'n' basic structures and the pads $48y$, $50y$, $52y$, and $54y$ which are electrically connected to 'm-n' basic structures. In this manner, there is provided a semiconductor device in which 'n' unit FETs operate effectively. In addition, the 'm-n' unit FETs also can be operated as FETs by applying a voltage to the pads $48y$, $50y$, $52y$, and $54y$ formed thereon.

<Fourth Embodiment>

Figure 10:
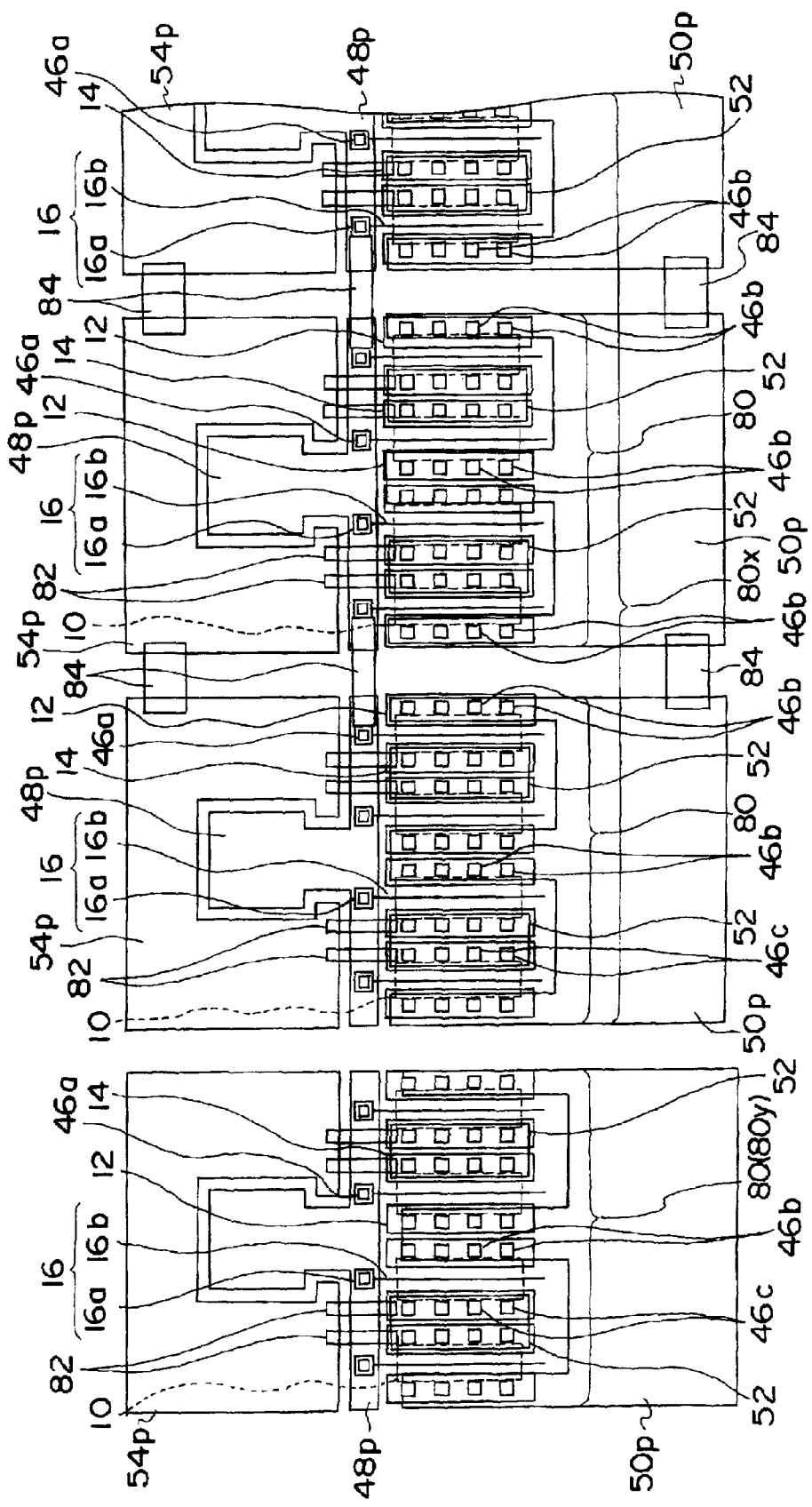
FIG. 10 is a schematic pattern perspective view of the semiconductor device, illustrating a fourth embodiment.
Figure 11A:
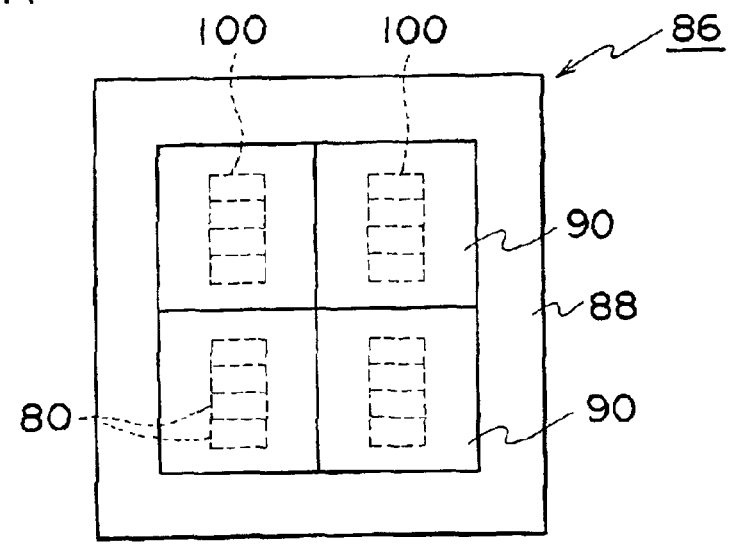
FIG. 11A is a schematic configuration of a mask employed for forming a first pad wiring and a second pad wiring.
Figure 11B:
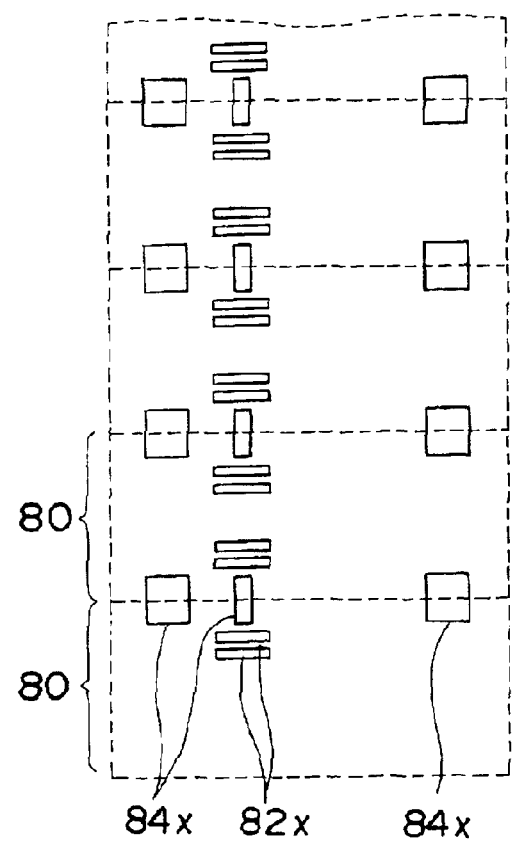
FIG. 11B is an enlarged view of essential parts of this mask.
Figure 12A:
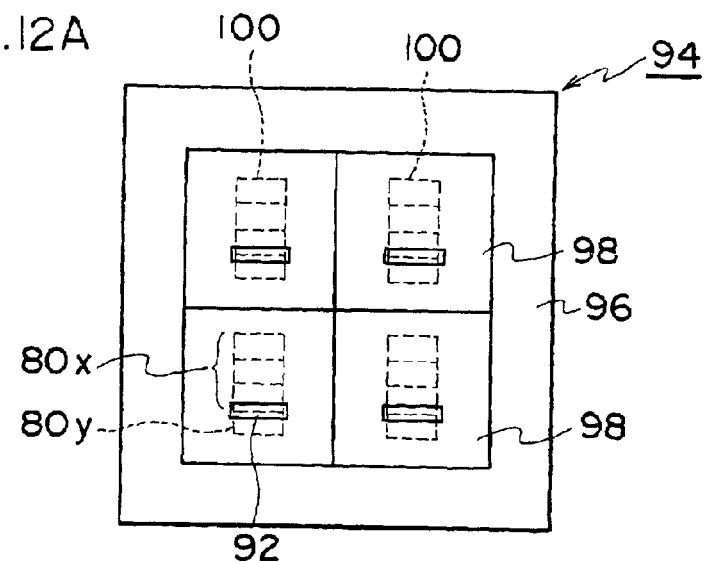
FIG. 12A is a schematic configuration of a mask for erasing a partial pattern for wiring between the second pads.
Figure 12B:
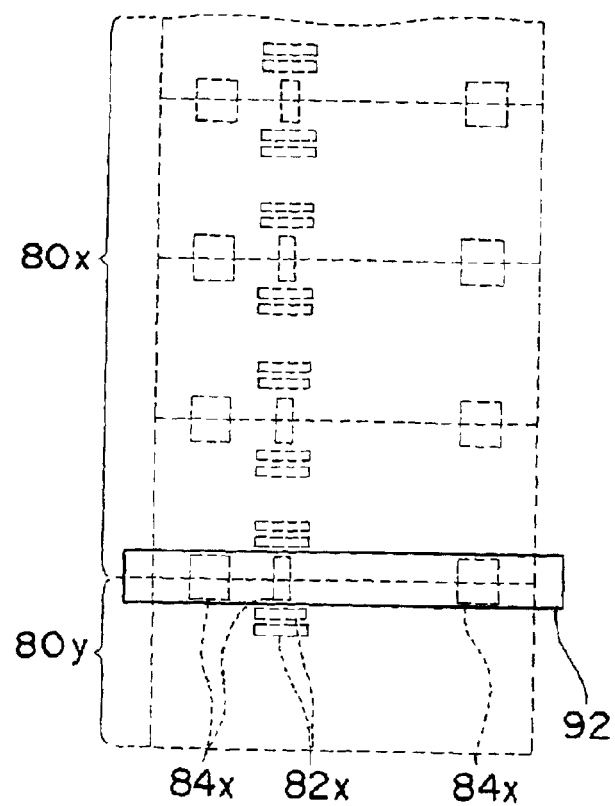
FIG. 12B is an enlarged view of essential parts of this mask.
Figure 13:
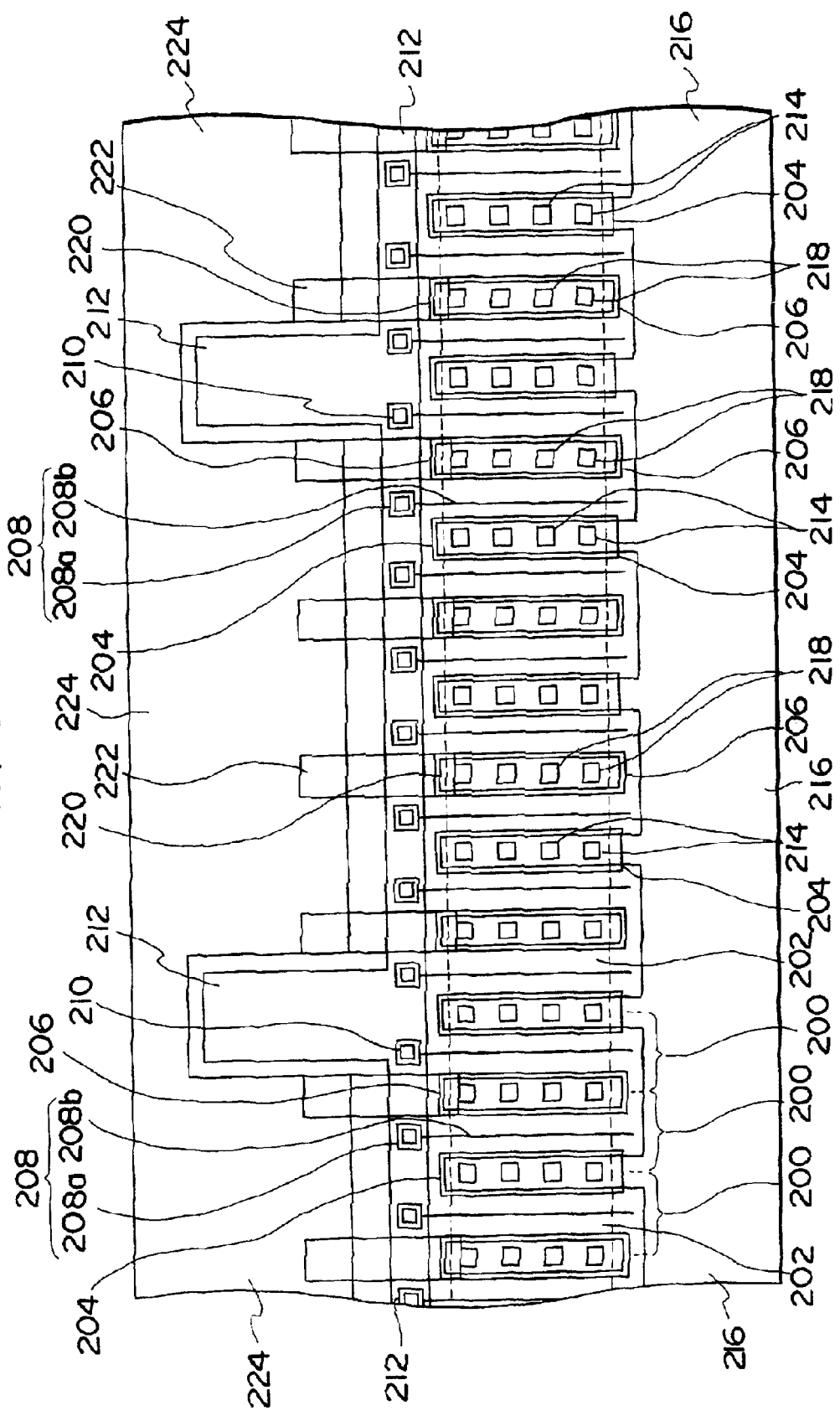
FIG. 13 is a schematic pattern perspective view of a conventional semiconductor device.

As a fourth embodiment, a method of fabricating a semiconductor device according to the present invention will be described with reference to FIG. 10, FIGS. 11A–11B, and FIGS. 12A–12B, by way of a preferred embodiment that differs from the first to third embodiments. FIG. 10 is a pattern perspective view of a semiconductor device (FET chip) according to this embodiment when viewed from the top. FIGS. 11A–11B each show a configuration of a mask employed for exposure while the first pad wiring and the second pad wiring are formed. FIGS. 12A–12B each shows a configuration of a mask for erasing a part of the second pad wiring.

Hereinafter, the points that differ from the first to third embodiments will be described, and a detailed description of points similar to these embodiments will be omitted.

First, as in the first to third embodiments, 'm' active layer regions are provided on a substrate on which a basic structure of a unit FET is formed.

Next, the 'm' basic structures are divided into 'x' unit FET blocks composed of a plurality of basic structures, and the number 'y' of unit FET blocks in which a desired drain current value is obtained is determined.

In this example, 'm' basic structures 100 are defined as 'x' (m/4) unit FET blocks composed of four basic structures. As in the first to third embodiments, one basic structure is employed as a TEG-FET by referring to FIG. 2; the drain current value of the semiconductor device to be produced is predicted from the drain current value measured using the TEG-FET, and is compared with a desired drain current value; and the required number 'n' of unit structures is determined. The number of unit FET units 80 to which this 'n' corresponds is calculated, and 'y' is obtained. Here, n may be divided by 4, i.e., the number of unit structures 100 that configures the unit FET blocks 80. 'y' denotes the number of unit FET blocks in which a desired drain current value is obtained.

Next, an inter-layer insulating film is formed on 'x' unit FET blocks 80.

Then, the first to third contact holes 46a to 46c that correspond to 'm' basic structures are formed on the inter-layer insulating film.

Next, a gate pad $48p$ is formed in the first contact hole 46a and on the inter-layer insulating film in unit FET blocks 80; a source pad $50p$ is formed in the second contact hole 46b and on the inter-layer insulating film in unit FET blocks 80; a first drain pad 52 is formed in the third contact hole 46c and on the inter-layer insulating film in unit FET blocks 80; and a second drain pad $54p$ is formed on the inter-layer insulating film in unit FET blocks 80, the pad being spaced apart from the first drain pad 52.

Here, when the above pads $48p$, $50p$, 52, and $54p$ are formed, a resist film is first formed on the inter-layer insulating film. This resist film is patterned, and a pad forming mask is formed. The shape of the pattern formed at this mask is in 'x' unit blocks, namely, in a pad pattern shape in which four unit FETs are electrically connected to each other. Thereafter, the pad forming material is vapor-deposited by employing the pad forming mask, and is lifted off, and the pads $48p$, $50p$, 52, and $54p$ are thereby formed (FIG. 10).

Next, a first pad wiring 82 that connects the first drain pad 52 and the second drain pad $54p$ to each other is formed, and there is formed a second pad wiring 84 in which 'y' gate pads $48p$, source pads $50p$, and second drain pads $54p$ of the 'x' pads are coupled with each other, respectively.

When the first pad wiring 82 and the second pad 84 are to be formed, there is first formed a negative resist film on the structure on which each of the pads $48p$, $50p$, $54p$, and 52 are formed. Then, a first pad wiring pattern $82x$ that connects the first drain pad 52 and the second drain pad $54p$ to each other; and a second pad wiring pattern $84x$ that couples the gate pad $48p$, source pad $50p$, and the second drain pad $54p$ all together expose the above resist film by employing a mask 86 that is a cover portion (FIGS. 11A–11B). This mask 86 has four exposure regions 90 for exposing four regions on 'x' unit FET blocks 80 in a reticle frame 88 (FIG. 11A). FIG. 11B shows the shapes of the first pad wiring pattern $82x$ and the second pad wiring pattern $84x$ in the exposure regions 90.

Next, the above resist film is further subjected to exposure by employing a mask 94 in which a window pattern 92 for erasing the second pad wiring pattern $84x$ that couples the pads with each other in two unit FET blocks (FIGS. 12A–12B) is formed. The window pattern 94 has at least a shape that encloses a second pad wiring forming region provided between the two adjacent unit FET blocks 80. The mask 94 is aligned so that this window pattern 92 is positioned at the boundary between block regions $80x$ of 'y' unit FET blocks and the region $80y$ of non-'y' (x–y) unit FET blocks 80y (FIG. 12B). The mask 94 has four exposure regions 98 capable of simultaneously exposing four regions on 'x' unit FET blocks in the reticle frame 96 (FIG. 12A).

After the two-step exposure has been completed, a development process is carried out, and a resist mask having the first and second pad wiring patterns is obtained.

After a wiring material has been vapor-deposited by employing a resist mask, the material is lifted off, whereby there is formed a first pad wiring 82 and a second pad wiring 84 that couples the pads 48p, 50p, and 54p with each other in 'y' unit FET blocks 80 (FIG. 10).

Thereafter, as in the first to third embodiments, a passivation film is formed on the top surface of the structure, and then, a hole for making electrical connections to each pad is formed (not shown).

As a result, 'x' unit FET blocks each having four unit FETs are formed on an active layer region 10. Unit FET blocks 80 in 'y' unit FET blocks 80x are electrically connected to each other via the second pad wiring 84. In the semiconductor device to be fabricated, 'n' FETs in the regions 80x of these 'y' unit FET blocks each can be operated effectively. In addition, the gate pad 48p, source pad 50p, and drain pads 54p and 52 are also formed in the region 80y of unwanted x-y unit FET blocks of the x blocks. Thus, a voltage is applied to these pads, whereby the FETs in the region 80y can be operated.

In the aforementioned first to fourth embodiments, although a description has been given by using an FET having a GaAs recess gate as an example, the basic structure of the unit FET is not limited thereto and may be a planar FET. In this case, for example, the basic structure may be formed by the following steps of:

selectively implanting ion on a substrate, thereby forming an active layer region;

forming a gate electrode on the active layer region;

annealing step for activating the active layer region; and forming a source electrode and a drain electrode as an ohmic electrode in the active layer region.

The step of forming 'n' contact hole patterns according to the first embodiment comprises the sub-step of developing a resist film provided on an inter-layer insulating film after exposure 'n' times. However, instead of this sub-step, this step may comprise the sub-step of: forming a latent image of 'm' contact hole patterns on a resist film, and further carrying out exposure by employing a mask having a window pattern in order to erase unwanted 'm−n' contact hole pattern latent images, thereby obtaining a resist pattern having 'n' contact hole patterns after development.

In the second embodiment, the step of selectively forming pads by 'n' unit FETs includes: providing a negative resist film on a structure, carrying out exposure for this resist film, thereby forming pad pattern latent images by 'm' unit FETs; and then, carrying out exposure for erasing 'm−n' pad pattern latent images. This step further comprises the sub-step of forming resist patterns by 'n' unit FETs after development. Instead of this sub-step, the above step may comprise the sub-step of: providing a positive resist film on the structure and thereon repeating exposure processing 'n' times by employing a mask that has a pad pattern by each unit FET; and forming a resist pattern that has pad patterns by 'n' unit FETs by developing the pattern.

In the fourth embodiment, there has been described an example in which the first pad wiring and the second pad wiring are directly formed without an inter-layer film being interposed on the pad. However, the step for forming a wiring may be changed as follows. That is, after the gate pad, source pad, and drain pad have been formed, an inter-layer film is formed, the contact hole to be connected to each pad is formed in this inter-layer film, and the wiring may be provided on the inter-layer film so as to fill this contact hole. In this case, a contact hole is provided so that the pads in 'y' unit FET blocks are coupled with each other, whereby the unit FETs in 'y' unit FET blocks can be operated effectively.

What is claimed is:

1. A method of fabricating a semiconductor device that has a structure in which a plurality of unit FETs are arranged in a line, the method comprising the steps of:

(a) defining as 'p' the number of said unit FETs in which a desired drain current value is obtained in the semiconductor device, forming basic structures of 'm' unit FETs which is more than the 'p', measuring a drain current value of one of the basic structures, and then, predicting from the measured value a drain current value of a semiconductor device after it is fabricated;

(b) comparing said predicted value with said desired drain current value, thereby determining the number 'n' of basic structures in which the desired drain current value is obtained.

2. A method according to claim 1, wherein a wiring pattern is formed for said 'n' basic structures.

3. A method according to claim 1, wherein there is provided a characteristic chart that shows a relationship between a drain current value of each of the basic structures at a time when the basic structures of the semiconductor fabricated by employing similar fabricating methods are formed; and a drain current value of the semiconductor device after is fabricated, and wherein a value uniquely obtained by causing said measured value to correspond to the characteristic chart is defined as said predicted value.

4. A method of fabricating a semiconductor device that has a structure in which a plurality of unit FETs are arranged in a line, the method comprising the steps of:

(a) determining in advance a number 'p' of said unit FETs in which a desired drain current value is obtained in the semiconductor device, and forming 'm' active layer regions more than said number 'p' so as to be arranged in a line on a substrate;

(b) forming a gate electrode, a source electrode, and a drain electrode, respectively on each of said 'm' active layer regions, thereby forming basic structures of said 'm' unit FETs;

(c) predicting a drain current value of said semiconductor device from a value obtained by measuring a drain current value of one of said basic structures, and comparing the predicted value with said desired drain current value, thereby determining the number 'n' of said basic structures that satisfies the desired drain current value;

(d) forming an inter-layer insulating film on said basic structure; and (e) forming simultaneously a first contact hole that penetrates the inter-layer insulating film, and that exposes part of a surface of said gate electrode; a second contact hole that penetrates said inter-layer insulating film, and that exposes part of a surface of said source electrode; and a third contact hole that penetrates said inter-layer insulation layer, and that exposes part of a surface of said drain electrode, wherein said first, second and third contact holes are formed for only a region of 'n' basic structures of said inter-layer insulating film, provided that m≧n, and m, n>0.

5. A method according to claim 1, wherein the number 'n' of said basic structures is a minimum number 'n' that satisfies the equation $I_{dss} \times n/m \geq I_{dss\ design}$ where said predicted value is defined as $I_{dss}$, and said desired drain current value is defined as $I_{dss\ design}$.

6. A method according to claim 1, wherein the step (e) of forming said first, second, and third contact holes comprises the sub-steps of:

(i) forming a resist film on said inter-layer insulating film;

(ii) employing a mask having provided thereon a window for forming contact holes corresponding to each of said first, second, and third contact holes formed in a region of said inter-layer insulating film of each of said basic structures, thereby carrying out the sub-step of carrying out exposure and developing for said resist film while said mask is shifted by one of said basic structures at a time to form a resist pattern having 'n' contact hole patterns; and (iii) employing said resist pattern, thereby carrying out an etching process of said inter-layer insulating film.

7. A method of fabricating a semiconductor device that has a structure in which a plurality of unit FETs are arranged in a line, the method comprising the steps of:

(a) determining in advance a number 'p' of said unit FETs in which a desired drain current value is obtained in the semiconductor device, and forming 'm' active layer regions more than said number 'p' so as to be arranged in a line on a substrate;

(b) forming a gate electrode, a source electrode, and a drain electrode, respectively on each of said 'm' active layer regions, thereby forming basic structures of said 'm' unit FETs;

(c) predicting a drain current value of said semiconductor device from a measured value obtained by measuring a drain current value of each of said basic structures, and comparing the predicted value with said desired drain current value, thereby determining the number 'n' of said basic structures that satisfies the desired drain current value;

(d) forming an inter-layer insulating film on said basic structure;

(e) simultaneously forming a first contact hole that penetrates the inter-layer insulating film, and that exposes part of a surface of said gate electrode; a second contact hole that penetrates said inter-layer insulating film, and that exposes part of a surface of said source electrode; and a third contact hole that penetrates said inter-layer insulating film, and that exposes part of a surface of said drain electrode;

(f) the pad forming step of forming a gate pad each in said first contact hole and on said inter-layer insulating film, forming a source pad each in said second contact hole and on said inter-layer insulating film, forming a first drain pad each in said third contact hole and on said inter-layer insulating film, and forming a second drain pad on said inter-layer insulating film, the second drain pad being spaced apart from said first drain pad; and (g) forming an air bridge wiring that connects said first drain pad and said second drain pad to each other, wherein said pad forming step is carried out for a region of said 'n' basic structures of said inter-layer insulating film, provided that $m \geq n$, and m, n>0.

8. A method according to claim 7, wherein the number 'n' of said basic structure is a minimum number 'n' that satisfies the equation $I_{dss} \times n/m \geq I_{dss\ design}$ where said predicted value is defined as $I_{dss}$, and said desired drain current value is defined as $I_{dss\ design}$.

* * * * *